(12) United States Patent                    (10) Patent No.:     US 6,383,866 B1
Mizukoshi et al.                             (45) Date of Patent:      May 7, 2002

(54) SEMICONDUCTOR DEVICE AND MANUFACTURING METHOD THEREOF

(75) Inventors: Toshikazu Mizukoshi; Ikuo Kurachi, both of Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/289,610

(22) Filed: Apr. 12, 1999

Related U.S. Application Data

(62) Division of application No. 08/941,065, filed on Sep. 30, 1997.

(30) Foreign Application Priority Data

May 8, 1997 (JP) ............................................. 9-117956

(51) Int. Cl.[7] ......................................... H01L 21/8242
(52) U.S. Cl. ..................... 438/253; 438/255; 438/396; 438/398
(58) Field of Search ............................ 638/255, 396, 638/397, 398, 253, 254

(56) References Cited

U.S. PATENT DOCUMENTS

| | | | | |
|---|---|---|---|---|
| 5,100,826 A | * | 3/1992 | Dennison | 438/396 |
| 5,150,276 A | * | 9/1992 | Gonzalez et al. | |
| 5,389,560 A | * | 2/1995 | Park | 438/397 |
| 5,389,568 A | * | 2/1995 | Yun | |
| 5,658,381 A | * | 8/1997 | Thakur et al. | 438/398 |
| 5,789,289 A | * | 8/1998 | Jeng | 438/396 |
| 5,798,545 A | * | 8/1998 | Iwasa et al. | 257/301 |
| 6,077,755 A | * | 6/2000 | Green | 438/396 |
| 6,303,431 B1 | * | 10/2001 | Linliu | 438/253 |
| 6,323,100 B1 | * | 11/2001 | Kimura | 438/397 |

\* cited by examiner

*Primary Examiner*—Mary Wilczewski
(74) *Attorney, Agent, or Firm*—Rabin & Berdo

(57) ABSTRACT

A $Si_3N_4$ film and a side wall are provided on an electrode to obtain a Cs capacitor capable of enlarging an area of a memory cell contact of a DRAM, and a hole if formed penetrating an inter-layer film by a selective etching process. The $Si_3N_4$ film and the side wall are left without being etched, and an area of the hole through which a substrate is exposed, is smaller than an upper portion area of the hole.

15 Claims, 19 Drawing Sheets

SEMICONDUCTOR DEVICE AND MANUFACTURING METHOD THEREOF

This application is a division of application Ser. No. 08/941,065 filed Sep. 30, 1997.

BACKGROUND OF THE INVENTION

The present invention relates generally to a semiconductor device and a manufacturing method thereof and, more particularly, to a semiconductor device and a manufacturing method thereof, which have characteristics in terms of a structure of a capacitor and in terms of a method of manufacturing this capacitor.

A dynamic DRAM contains capacitors for storing information. These capacitors are arranged in a matrix in a memory device. Among these capacitors, a capacitor in a predetermined position is selected based on address information supplied from outside. The selected capacitor is supplied with information converted into an electric charge by a write control system.

When in a reading process, the capacitor in the predetermined position is selected based on the address information, and the electric charge of the selected capacitor is read to a bit line previously charged by a read control system. This electric charge is amplified by a sense amplifier and then outputted to outside.

FIG. 2 is a diagram of one example of a DRAM memory cell mask pattern, showing a structure of the capacitors in the DRAM having a conventional COB structure. AC areas y1 are formed obliquely in FIG. 2, and bit lines y2 extend in an X-direction while word lines y3 extend in a Y-direction. Hereinafter, mainly an X-directional structure and a manufacturing method thereof will be explained with reference to FIGS. 3, 5 and 7, while a Y-directional structure is shown in FIGS. 4, 6 and 8.

FIG. 3 shows an X-directional section in the middle of a process of manufacturing the capacitor illustrated in FIG. 2. FIG. 4 shows a Y-directional section from FIG. 2. Provided on a substrate 51, composed of a semiconductor such as Si monocrystal or the like, are a field oxide film 52 having a thickness on the order of 2000–4000 A and a MOS transistor (Tr) gate oxide film 53 having a thickness of approximately 50–150 A, which are formed normally by a LOCOS (Local Oxidation of Silicon: Selective Oxidation) method.

After the gate oxide film 53 and the field oxide film 52 have been formed, a plurality of electrodes 54 supplied with signals for capacitors are provided on these films. Then, insulating oxide films 55 are provided on both sides of these electrodes 54. The electrode 54 composed of polysilicon or polycide is formed to a thickness of approximately 1000–2000 A and subjected to patterning in the Y-direction by ordinary photolithography and etching.

After the electrodes 54 and the oxide films 55 have been formed, BPSG (borophosphosilicate glass) films 56 are formed thereon by a CVD (Chemical Vapor Deposition) method. This BPSG film 56 is formed with a hole 57 penetrating the BPSG film 56 and the gate oxide film 53, through which the substrate 51 is exposed. Provided also is an electrode 58 connected to the substrate 51 exposed through the hole 57. The electrode 58, composed of polysilicon and polycide, is subjected to X-directional patterning by ordinary photolithography as well as by etching, and is thus formed.

Thereafter, as illustrated in FIG. 5, a resist pattern 60 is formed by ordinary photolithography, and a hole 61 is obtained (a Y-directional section is shown in FIG. 6) by etching. Next, as shown in FIG. 7, a polysilicon layer 62 that is approximately 5000–10000 A in thickness is provided as an electrode layer serving as one plate of the capacitor. Thereafter, a Si3N film 63, serving as a dielectric layer of the capacitor, is formed to a thickness on the order of 30–100 A on the surface of the electrode layer 62, and a polysilicon layer 64, serving as the other plate of the capacitor, is formed to a thickness of approximately 1000–2000 A on the Si3N film 63. The capacitor is thus completed. FIG. 8 illustrates a Y-directional section of this capacitor.

In the construction described above, however, an area of the memory cell contact 61 of the DRAM can not be enlarged when reducing the device, and hence there arises a problem of causing an increase in the number of steps for enlarging the capacitor area. Another problem is that a hole margin of the photolithography process of the memory cell contact is small.

It is a primary object of the present invention, which was contrived to obviate the problems given above, to provide a semiconductor device and a manufacturing method thereof, which are capable of enlarging an area of a DRAM memory cell contact.

It is another object of the present invention to provide a semiconductor device and a manufacturing method thereof, which are capable of increasing a hole margin of a photolithography process of a memory cell contact.

SUMMARY OF THE INVENTION

A semiconductor device according to the present invention comprises a semiconductor substrate, a gate electrode formed on the semiconductor substrate and extending in a first direction, a first protection layer formed along a side wall of the gate electrode as well as on the gate electrode and exhibiting an insulating property, an inter-layer insulating layer formed on the semiconductor substrate including the first protection layer, having an opening portion extending to the first protection layer and to the semiconductor substrate as well and exhibiting a selectivity for the first protection layer when in an etching process, and a capacitor formed inwardly of the opening portion.

The first protection layer may be, e.g., a nitride layer, and the inter-layer insulating layer may be, e.g., an oxide layer.

Further, the capacitor may be constructed of a first conductive layer connected to the semiconductor substrate and having a rugged surface, a capacitor insulating film formed on the first conductive layer, and a second conductive layer formed on the capacitor insulating film.

Alternatively, the inter-layer insulating layer may be constructed of a first insulating layer and a second insulating layer formed on the first insulating layer. The inter-layer insulating layer may contain a bit line provided between the first insulating layer and the second insulating layer and extending in a direction substantially orthogonal to the first direction, and a second protection layer provided on the bit line and along a side wall of the bit line and exhibiting a selectivity with respect to the inter-layer insulating layer when in an etching process and also an insulating property. The opening portion may extend to the second protection layer.

A semiconductor device manufacturing method according to the present invention is used for manufacturing the semiconductor device according to the present invention.

This manufacturing method comprises a step of forming a gate insulating film and a gate electrode extending in a first direction on a semiconductor substrate, a step of forming a protection layer exhibiting an insulating property on an upper portion of the gate electrode and along a side wall thereof, a step of forming a inter-layer insulating layer on the semiconductor substrate including the protection layer, a step of forming an opening portion extending to the protection layer and to the semiconductor substrate by selectively etching the inter-layer insulting layer, and a step of forming a capacitor inwardly of the opening portion.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS (First Embodiment)

Figure 1:
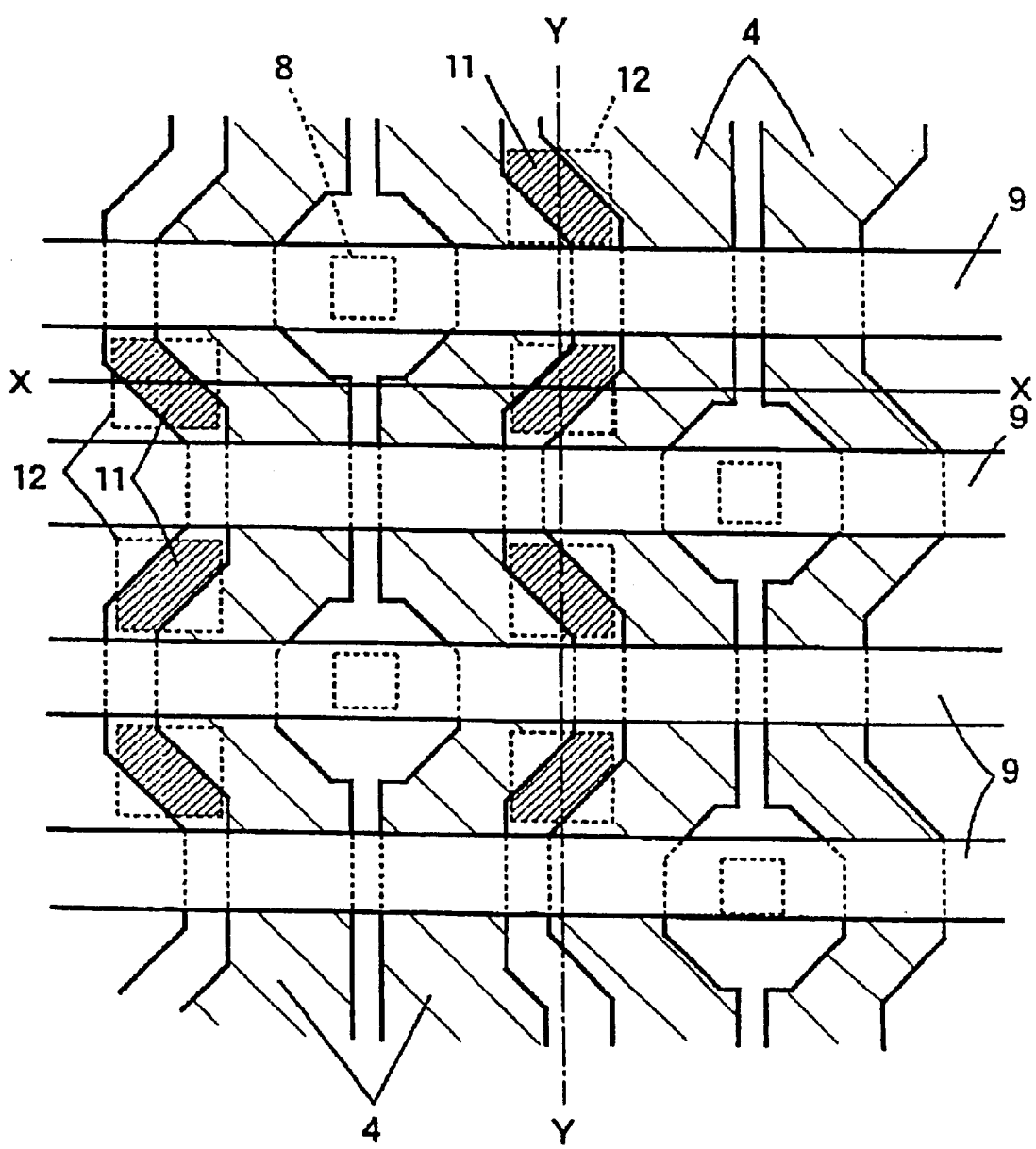
FIG. 1 is a plan view showing a construction of the principal portion of a DRAM in accordance with a first embodiment of the present invention.
Figure 2:
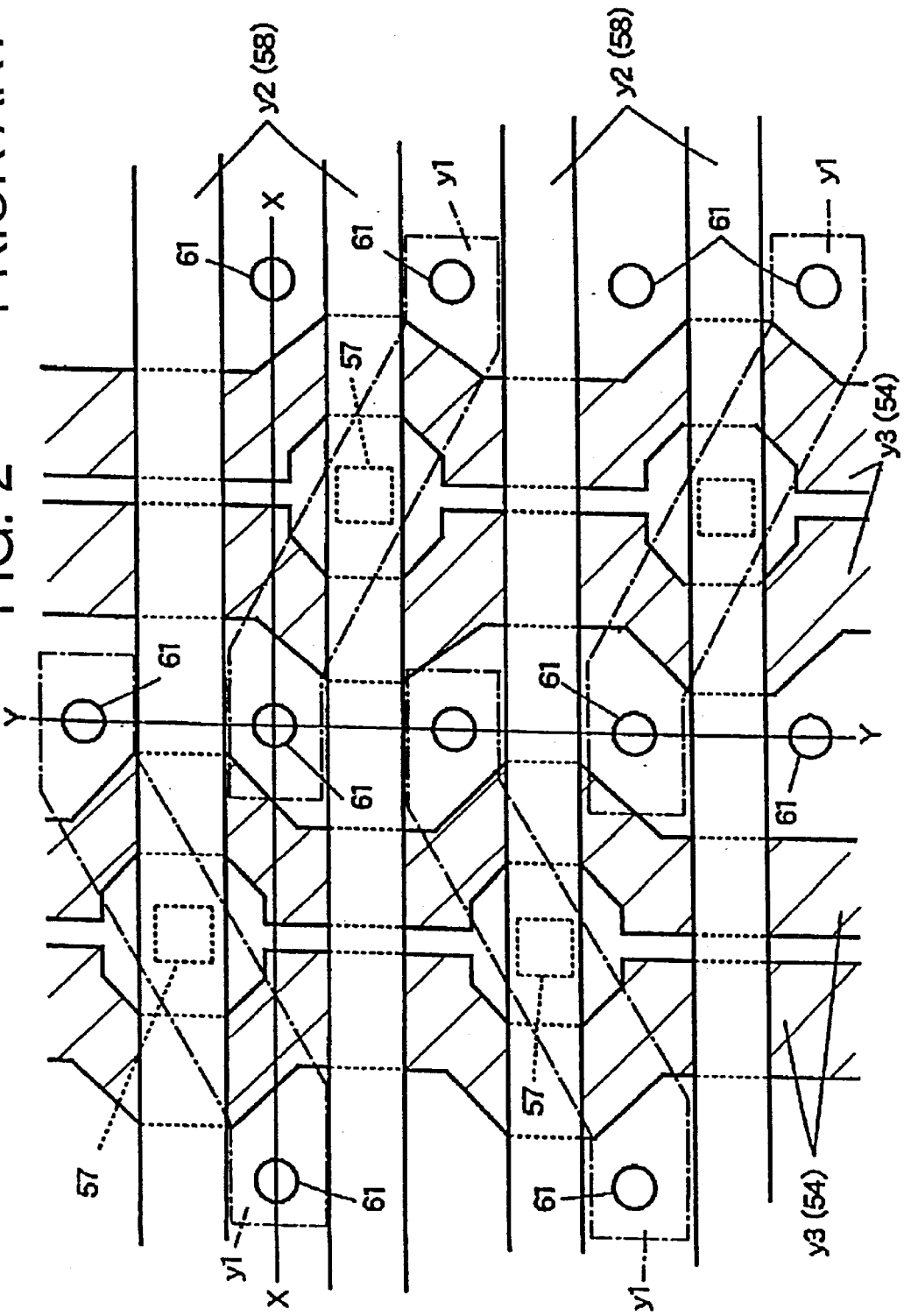
FIG. 2 is a plan view showing a construction of a prior art DRAM.
Figure 3:
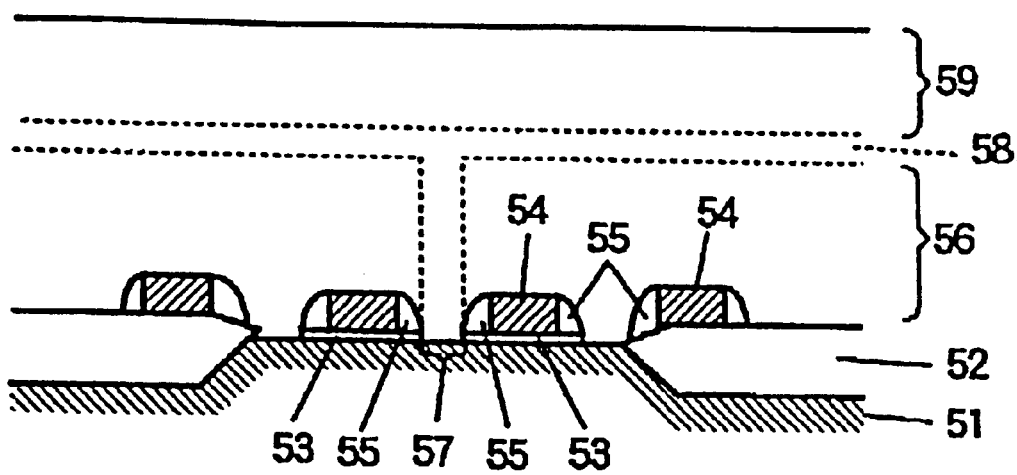
FIG. 3 is a sectional view showing steps of manufacturing the prior art DRAM.
Figure 4:
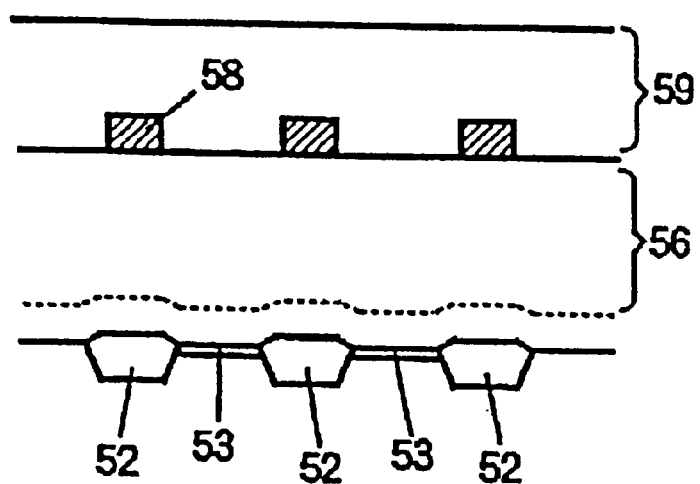
FIG. 4 is a sectional view showing steps of manufacturing the prior art DRAM.
Figure 5:
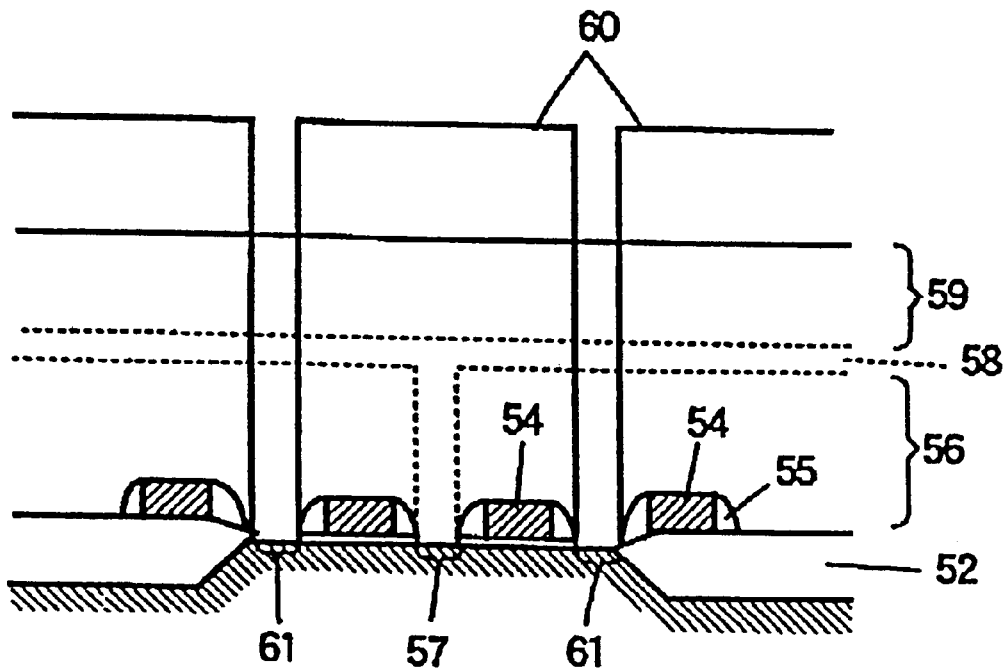
FIG. 5 is a sectional view showing the steps of manufacturing the prior art DRAM.
Figure 6:
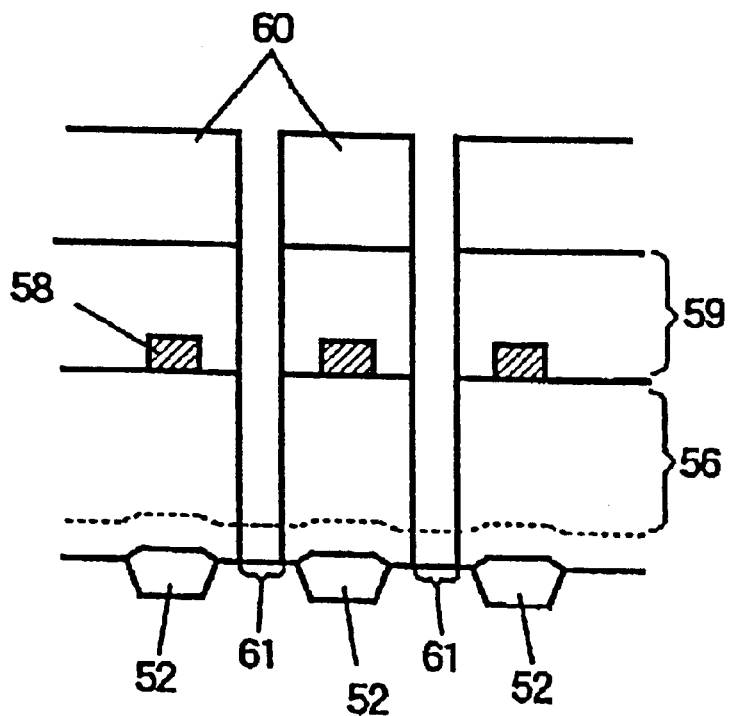
FIG. 6 is a sectional view showing the steps of manufacturing the prior art DRAM.
Figure 7:
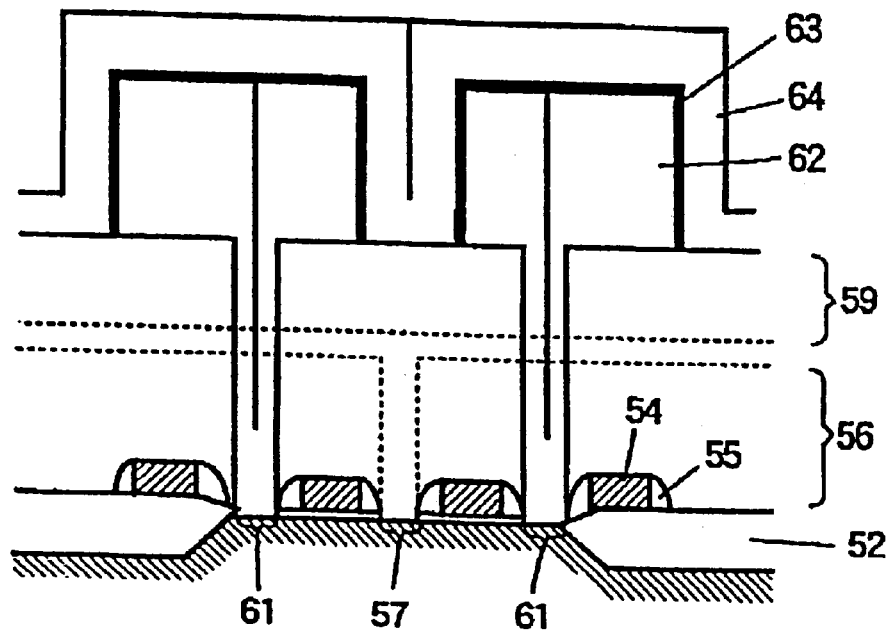
FIG. 7 is a sectional view showing a structure of the prior art DRAM.
Figure 8:
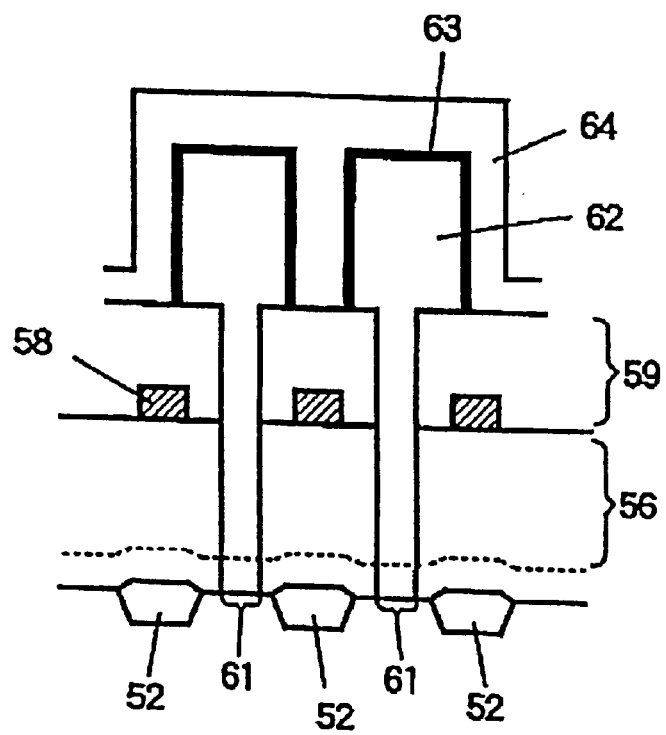
FIG. 8 is a sectional view showing the structure of the prior art DRAM.
Figure 9:
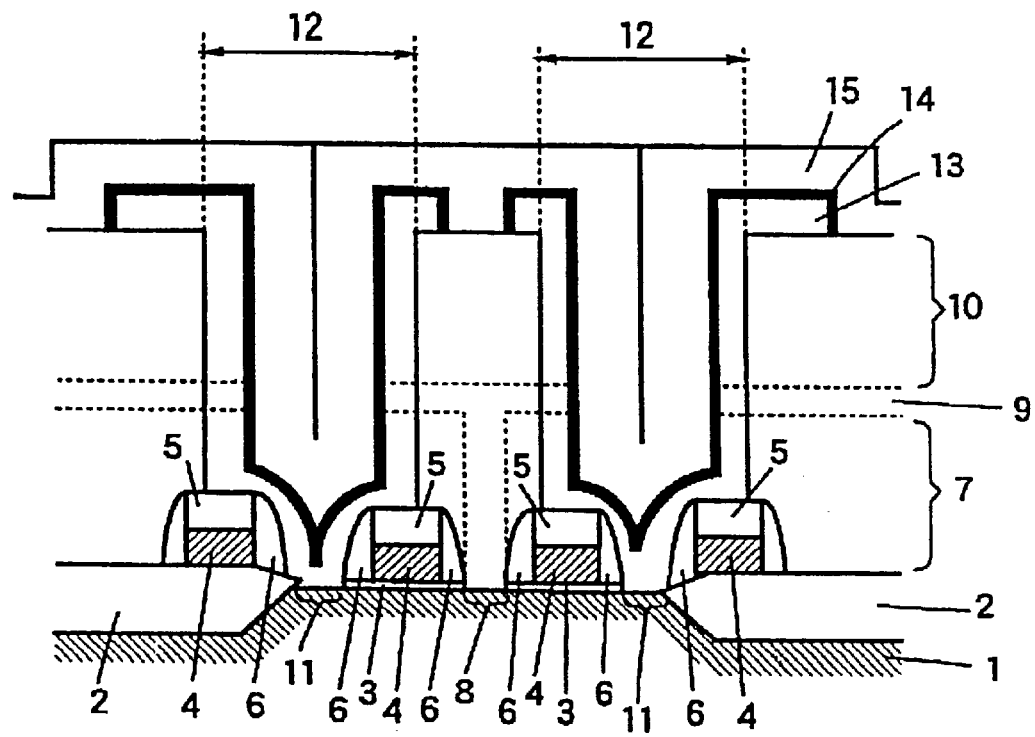
FIG. 9 is a sectional view showing a structure of the principal portion of a DRAM in a first embodiment of the present invention.
Figure 10:
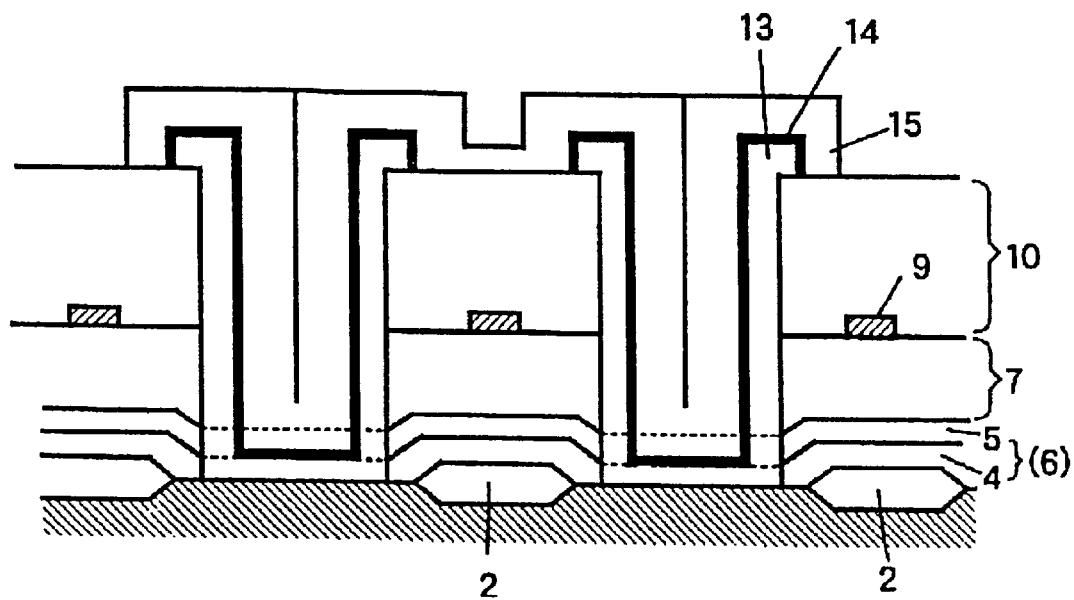
FIG. 10 is a sectional view showing the structure of the principal portion of the DRAM described above.

FIGS. 1, 9 and 10 are views each illustrating a structure of capacitors of a DRAM in accordance with a first embodiment of the present invention. FIG. 1 is a top view of the DRAM. FIGS. 9 and 10 are views respectively schematically showing an X—X section and a Y—Y section.

Provided on a substrate (a semiconductor substrate) 1. are a field oxide film 2 for separation between elements and a gate oxide film 3 corresponding to a gate of a MOS (Metal Oxide Semiconductor) transistor (Tr). An electrode (a gate electrode) 4 is provided on this gate oxide film 3, and a $Si_3N_4$ film (a protection layer) 5 is provided on the electrode 4. Further, side walls 6 are provided extending from a side surface of the electrode 4 to a side surface of the $Si_3N_4$ film 5.

Also formed on the field oxide films 2, the $Si_3N_4$ films 5 and the side walls 6 is a inter-layer film (an inter-layer insulating layer) 7 for separating these layers from layers formed thereon. This inter-layer film 7 is formed with a hole 8 through which the substrate 1 is exposed for a bit line contact. Provided, moreover, are an electrode 9 connected to the substrate 1 exposed from the hole 8, and an inter-layer film (an inter-layer insulating layer) 10 for separating the electrode 9 from a layer formed thereon. Note that the hole 8 and the electrode 9, as illustrated in FIGS. 1 and 9, do not exist on the X—X section in FIG. 1.

Then, a hole (an opening) 12 is formed penetrating the inter-layer films 10, 7. A hole 11, which exposes a part of the substrate 1 that is not covered with the protection layers 5, 6, is formed in the bottom of the hole 12. A capacitor for accumulating an electric charge corresponding to data to be held, is formed inwardly of this hole 12.

This capacitor comprises an electrode (a first conductive layer) 13 so provided on a surface of the inter-layer film 10 as to extend from the hole 11 along the periphery of the hole 12, and connected to the substrate 1 exposed from the hole 11. The capacitor also comprises a capacitor insulating film 14 formed on the surface of this electrode 13, and an electrode (a second conductive layer) 15 further provided thereon. Namely, the hole 11 serves as a memory cell contact for connecting the substrate 1 to the electrode 13.

The substrate 1 is composed of monocrystal of silicon (Si). The field oxide film 2 is formed in thickness on the order of 2000–4000 A by an ordinary LOCOS (Local Oxidation of Silicon: selective oxidation) method. The gate oxide film 3 is approximately 50–150 A in thickness. The electrode 4 is composed of polysilicon or polycide and has a thickness of approximately 1000–3000 A. The side wall 6 is composed of $Si_3N_4$ as in the case of the $Si_3N_4$ film 5. The electrode 4 is covered to a thickness of approximately 1000–3000 A by the side wall ($Si_3N_4$ film) 6 and the $Si_3N_4$ film 5. The inter-layer film 7 is composed of BPSG (borophosphosilicate glass: an oxide film to which boron and phosphorus are added) and is approximately 3000–5000 A thick. The electrode 9 is composed of polysilicon or polycide as in the case of the electrode 4 and has a width of approximately 1000–2000 A.

The inter-layer film 10 is composed BPSG as in the case of the inter-layer film 7 and has a thickness of approximately 3000–5000 A. The electrode 13 is composed of polysilicon having a thickness that is less than ½ the width of the hole 12. The hole 11 is formed by high selection ratio etching to selectively etch the inter BPSG layer films 7, 10 with respect to the $Si_3N_4$ films 5, 6. Therefore, the $Si_3N_4$ films 5, 6 are left on the bottom of the hole 11, and an aperture area of the hole 11 is smaller than an aperture area of the upper portion of the hole 12. A method of thus providing the protection layers (the $Si_3N_4$ films 5, 6) and holding only the area covered with no protection layer, is called a self alignment.

As described above, according to the first embodiment, the aperture area of the memory cell contact (the hole 12) can be enlarged while keeping small the aperture area of the bottom surface (the hole 11) of the memory cell contact by use of the self alignment for forming the memory cell contact. Therefore, the memory cell contact can be provided on the gate electrode, whereby the side wall of the contact (the hole 12) can be used as a capacitor surface area. Accordingly, the surface area of the capacitor per unit chip area can be set larger than by the prior art. An occupying area on the chip can be reduced while keeping a capacity of the capacitor.

Further, the hole area of the hole 12 can be taken large, and hence a margin when holing the resist layer through a pattern transfer can be enlarged in the photolithography in the case of holing the memory cell contact.

(Second Embodiment)

A second embodiment of the present invention deals with a manufacturing method of manufacturing the DRAM having a construction shown in FIGS. 1, 9 and 10. FIGS. 11–22 show respective steps of this manufacturing method.

Figure 11:
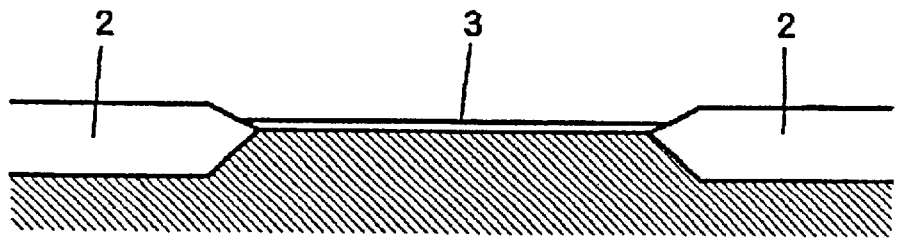
FIG. 11 is a sectional view showing manufacturing steps in a method of manufacturing the DRAM in a second embodiment of the present invention.

According to this manufacturing method, to start with, the field oxide film 2 having a thickness of approximately 2000–4000 A is formed on a Si monocrystal semiconductor substrate 1. This step generally involves the use of the LOCOS method. Thereafter, as illustrated in FIG. 11, the gate oxide film 3 of MOS-Tr is formed in thickness of approximately 50–150 A.

Figure 12:
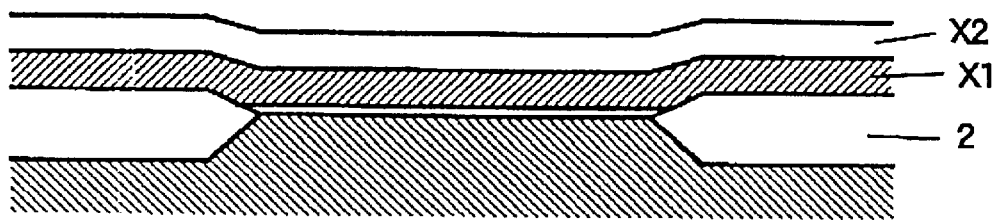
FIG. 12 is a sectional view showing the manufacturing steps in the method of manufacturing the above DRAM.

Next, a layer x1, which is composed of polysilicon or polycide and will become an electrode 4 afterward, is formed in thickness on the order of 1000–3000 A on the field oxide film 2 and the gate oxide film 3 by the CVD (Chemical Vapor Deposition) method. Then, as shown in FIG. 12, a $Si_3N_4$ layer x2, which will become a $Si_3N_4$ film 5 afterward, is formed in thickness of approximately 1000–3000 A on this layer x1.

Figure 13:
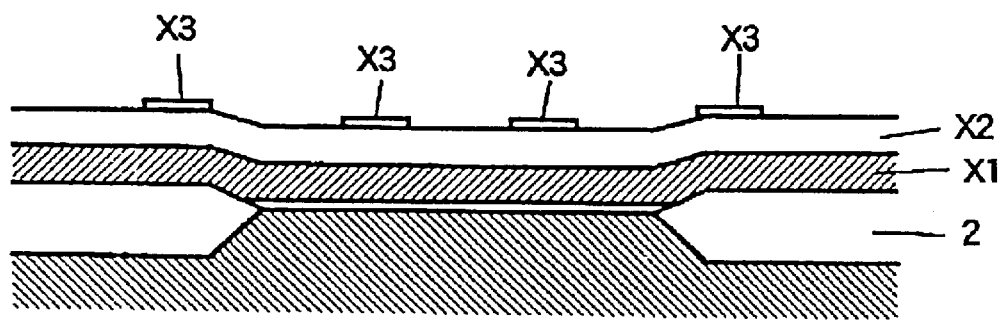
FIG. 13 is a sectional view showing the manufacturing steps in the method of manufacturing the above DRAM.
Figure 14:
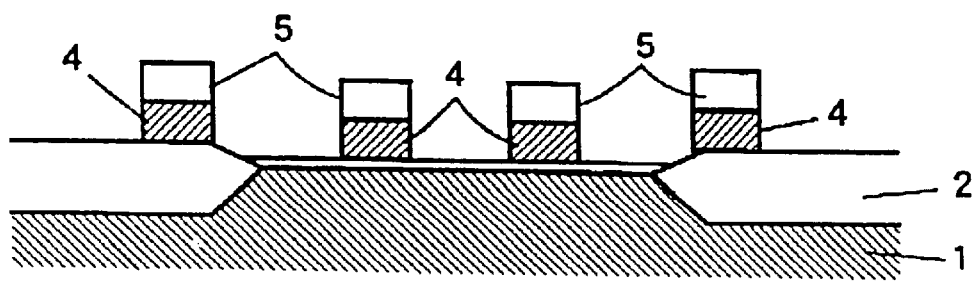
FIG. 14 is a sectional view showing the manufacturing steps in the method of manufacturing the above DRAM.
Figure 15:
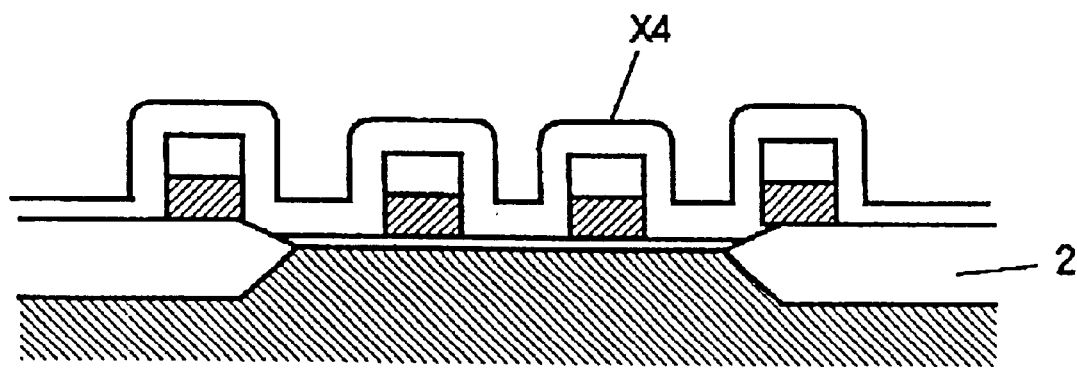
FIG. 15 is a sectional view showing the manufacturing steps in the method of manufacturing the above DRAM.
Figure 16:
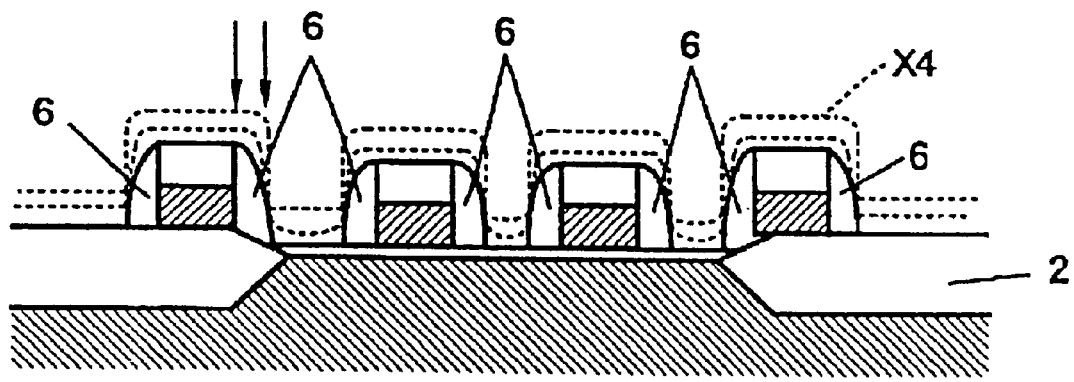
FIG. 16 is a sectional view showing the manufacturing steps in the method of manufacturing the above DRAM.

Thereafter, a photoresist layer x3 is formed on the layer x2, and, when etching is executed by removing the photoresist excluding necessary patterns as illustrated in FIG. 13, the electrode 4 and the $Si_3N_4$ film 5 are formed as shown in FIG. 14. Thereafter, as shown in FIG. 15, a $Si_3N_4$ layer x4, which will become a side wall 6 afterward, is formed by the CVD method, and the etching process is executed. This etching is anisotropic etching exhibiting a high up-and-down directivity in FIG. 15. With this etching carried out, as indicated by a broken line in FIG. 16, the $Si_3N_4$ layer x4 is uniformly etched in only the up-and-down direction, and the residual $Si_3N_4$ layer x4 becomes the side wall 6.

Figure 17:
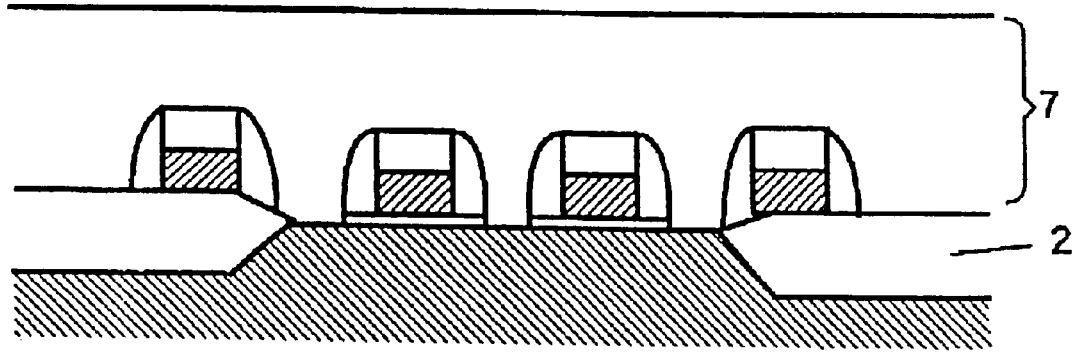
FIG. 17 is a sectional view showing the manufacturing steps in the method of manufacturing the above DRAM.
Figure 18:
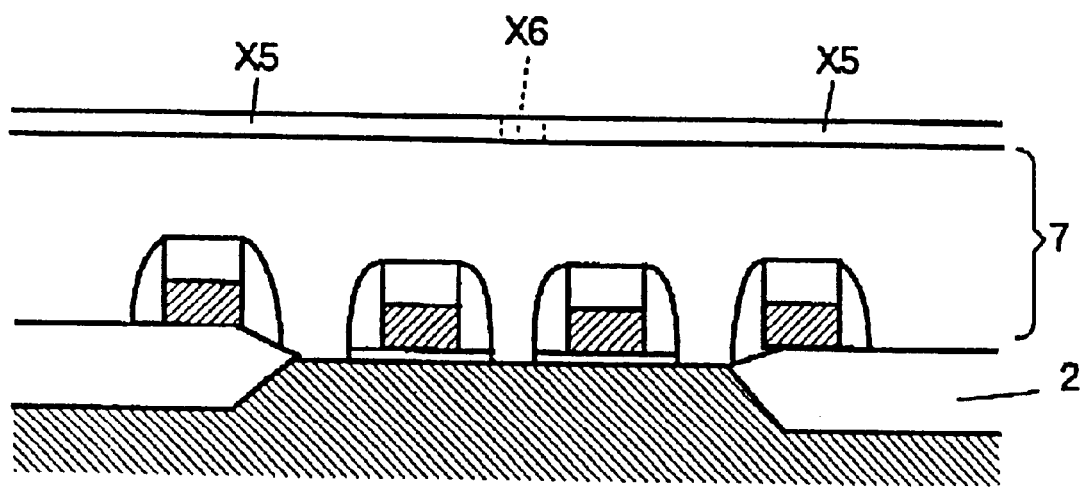
FIG. 18 is a sectional view showing the manufacturing steps in the method of manufacturing the above DRAM.

Next, as shown in FIG. 17, a BPSG film 7 having a thickness of approximately 3000–5000 A is formed by the CVD method, and the upper surface is flattened by effecting a flow. Thereafter, a photoresist layer x5 is provided on the BPSG film 7, and, as illustrated in FIG. 18, the photoresist is removed in a position x6 where a hole 8 is to be formed.

Figure 19:
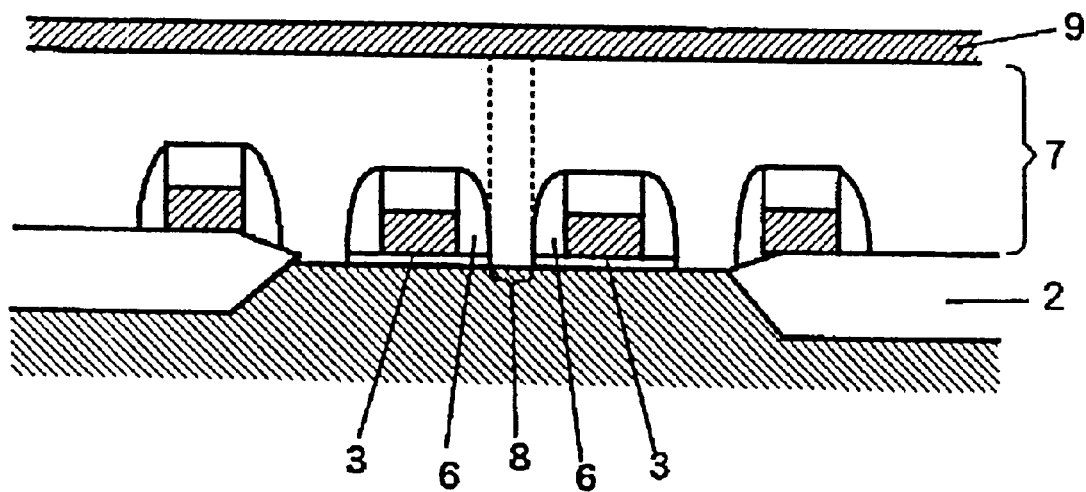
FIG. 19 is a sectional view showing the manufacturing steps in the method of manufacturing the above DRAM.

Thereafter, the hole 8 is formed by executing the etching process, and further a layer of polysilicon or polycide is formed by the CVD method. Moreover, when carrying out the patterning in the direction perpendicular to the sheet surface, i.e., in the direction horizontal to the surface of the substrate 1, as illustrated in FIG. 19, an electrode 9 is formed. Furthermore, a BPSG film 10 that is approximately 3000–5000 A in thickness is formed by the CVD method is formed on this electrode 9, and the upper surface is flattened by executing the flow.

Figure 20:
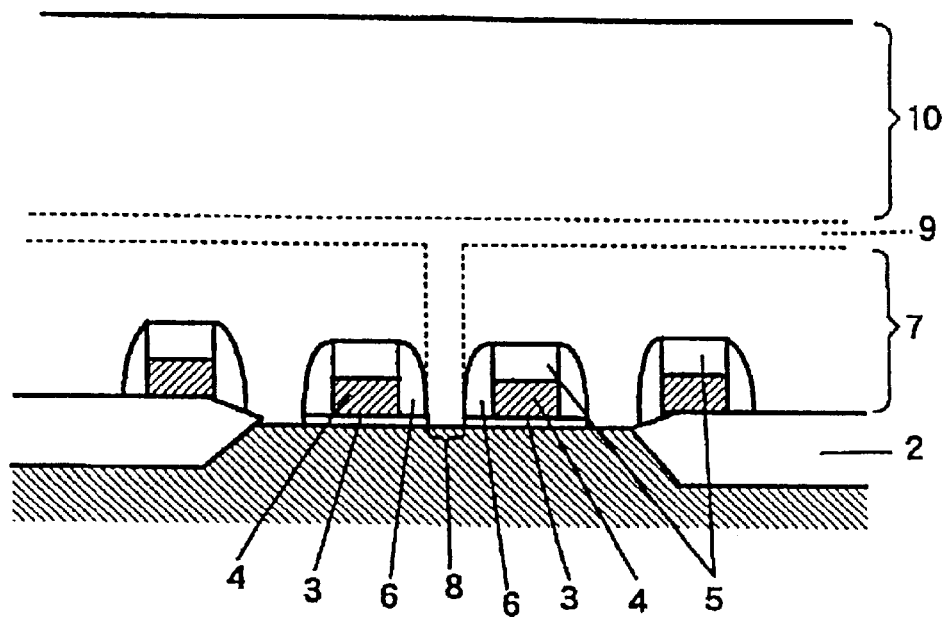
FIG. 20 is a sectional view showing the manufacturing steps in the method of manufacturing the above DRAM.
Figure 21:
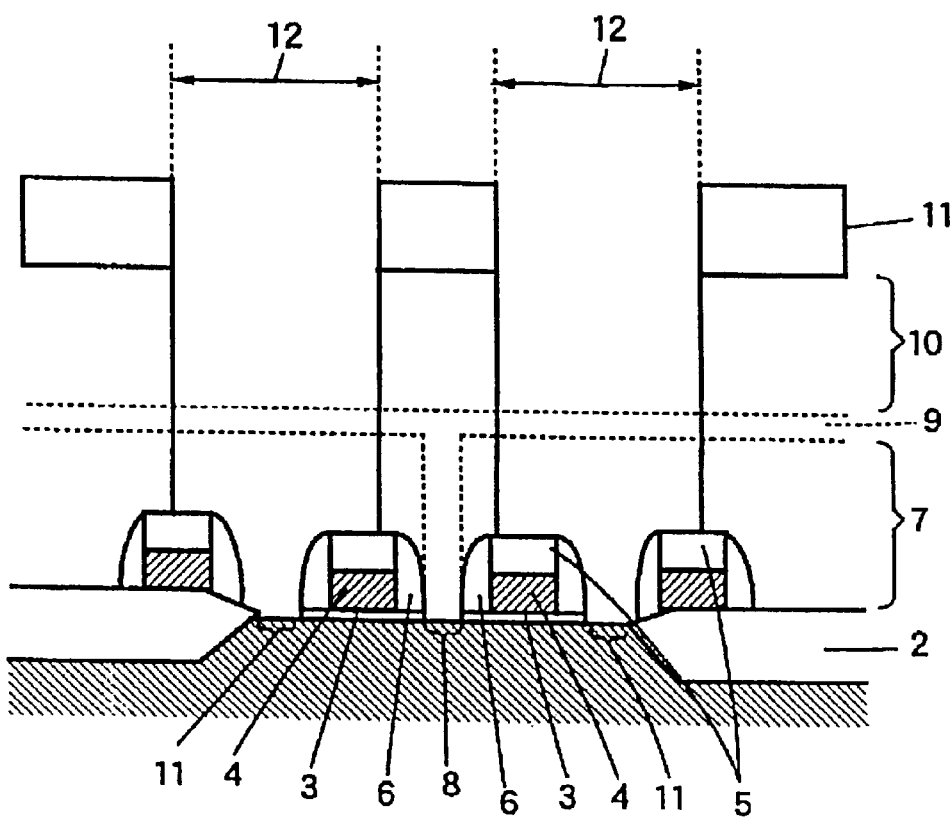
FIG. 21 is a sectional view showing the manufacturing steps in the method of manufacturing the above DRAM.

Thereafter, a photoresist layer 11 is provided on this BPSG film 10, and, as shown in FIG. 20, a selective etching process is carried out by removing the photoresist in a position that will correspond to a prospective hole 12. In this selective etching process, oxide films (BPSG films 7, 10) are selectively etched with respect to nitride films ($Si_3N_4$ films 5, 6), and therefore, as shown in FIG. 21, the $Si_3N_4$ films 5, 6 are left on the bottom of the hole 12 formed without being etched. This etching process involves the use of a gas mixed with C4F2, CO, Ar and O2 or a gas to which CH2F2 and CHF3 are added. Note that a composition ratio of this gas is properly varied corresponding to a size (e.g., a width of the hole 12) of the device. The oxide films (the BPSG films 7, 10) are selectively etched with respect to the nitride films (the $Si_3N_4$ films 5, 6) by executing the etching process using the gas described above.

A protection layer exhibiting a durability against the etching of the nitride film is formed, and, with the self alignment for forming the hole 11 by effecting the selective etching, the hole 12 is formed, whereby a width of the hole 11 can be set smaller than a width of the upper portion of the hole 12.

Figure 22:
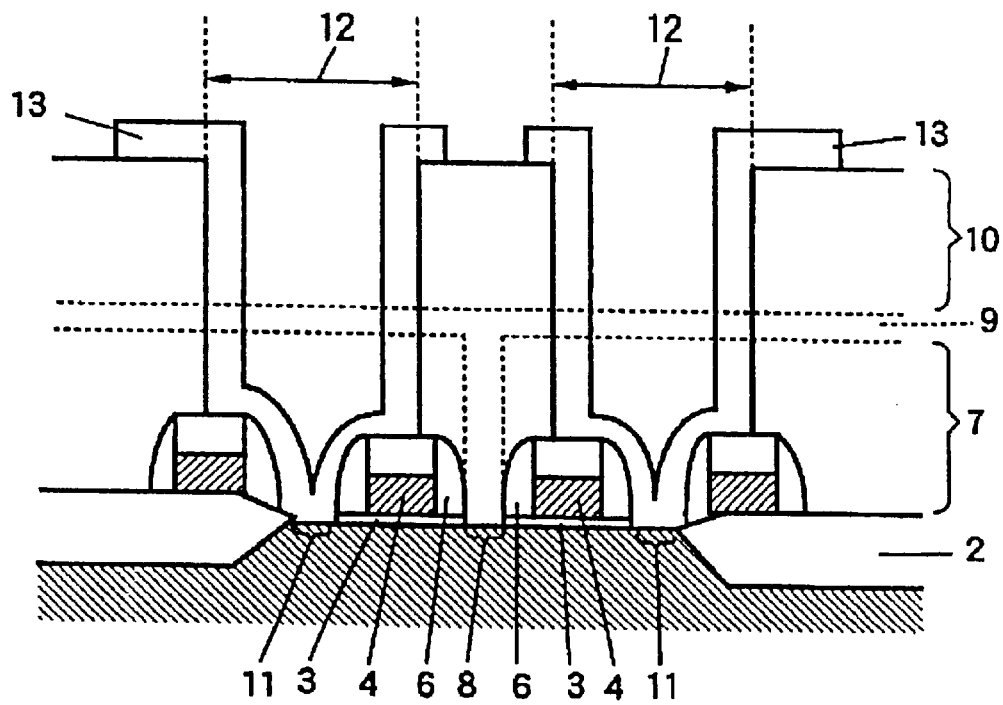
FIG. 22 is a sectional view showing the manufacturing steps in the method of manufacturing the above DRAM.

Moreover, an electrode layer of polysilicon having a thickness that is less than ½ the width of the hole 12, is formed by the CVD method, and unnecessary polysilicon is removed by the photolithography, with the result that an electrode 13 is formed as shown in FIG. 22.

Thereafter, an insulating film (a capacitor insulating film) 14 such as an oxide film and a nitride film is formed on the surface of the electrode 13 by thermal nitriding, thermal oxidation or the CVD method, etc., and finally an electrode 15 composed of polysilicon or the like is formed by the CVD method, etc. A DRAM is thereby completed with a structure illustrated in FIGS. 1, 9 and 10.

As stated above, in accordance with the second embodiment, the self alignment is used for forming the memory cell contact, thereby enabling the aperture area of the memory cell contact (the hole 12) to enlarge while keeping small the aperture area of the bottom surface (the hole 11) of the memory cell contact. Therefore, the memory cell contact can be provided on the gate electrode, whereby the side wall of the contact (the hole 12) can be used as a capacitor surface area. Accordingly, the surface area of the capacitor per unit chip area can be set larger than by the prior art.

Further, the aperture area of the hole 12 can be taken large, and hence it is feasible to enlarge the margin when holing the resists layer through the pattern transfer in the photolithography in the case of holing the memory cell contact.

Note that BPSG (borophosphosilicate glass: an oxide film to which boron and phosphorus are added) is used for the inter-layer films 7, 10 in the first and second embodiments discussed above, but the oxide films may also be used. In this case, the etching process with a high selectivity can be executed as in the case described above by changing the composition of the gas used for etching.

(Third Embodiment)

Figure 23:
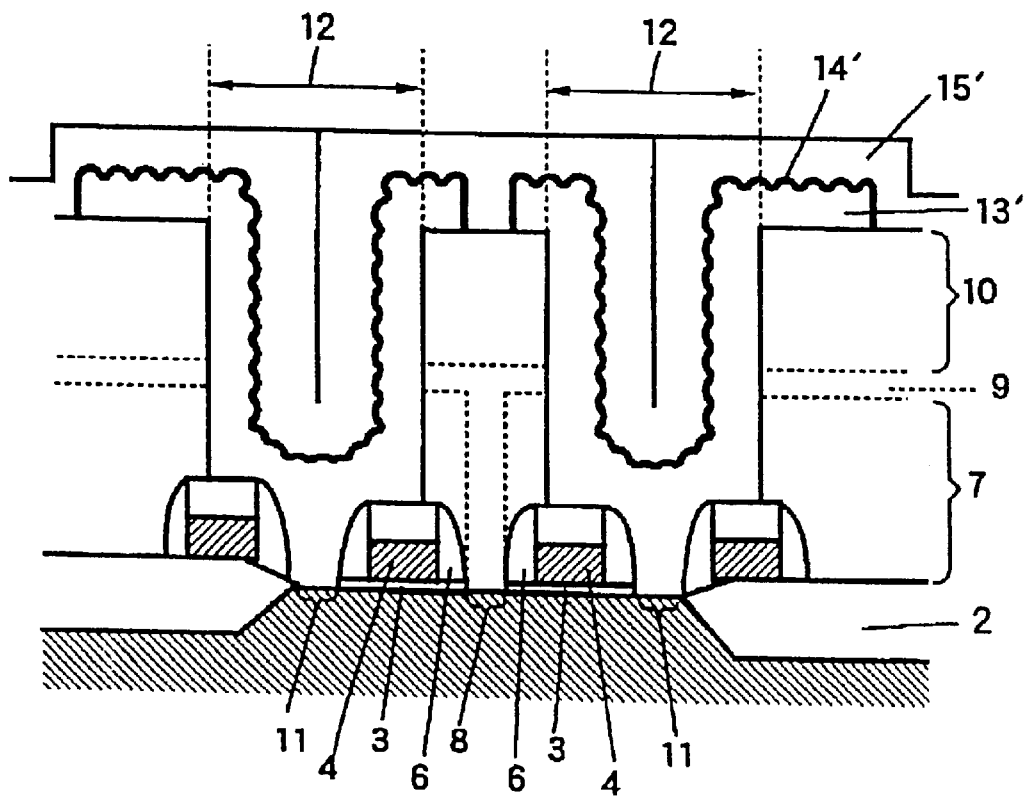
FIG. 23 is a sectional view showing a s tructure of the principal portion of the DRAM in a third embodiment of the present invention.

FIG. 23 is a view showing a structure of capacitors of the DRAM in accordance with a third embodiment of the present invention. FIG. 23 shows an X—X section in FIG. 1 and is, i.e., a sectional view corresponding to FIG. 9. In FIG. 23, the same or corresponding components as or to those in FIG. 9 are marked with the same numerals as those in FIG. 9. Further, a section corresponding to the Y—Y section is the same as FIG. 1 other than configurations of electrodes 13', 15' and is therefore omitted. Similarly, the plan view is the same as FIG. 1.

In the DRAM illustrated in FIGS. 1, 9 and 10, the electrode 13 of the capacitor has a flat surface. In the third embodiment, however, as shown in FIG. 23, the electrode 13' has a rugged surface. This electrode 13' is, as in the case of the electrode 13 shown in FIGS. 1, 9 and 10, composed of polysilicon and has a thickness that is less than ½ the width of the hole 12. A capacitor insulating film 14' and an electrode 15' also have rugged surfaces corresponding to the rugged surface of the electrode 13'.

The third embodiment exhibits the same effects as those in the first embodiment discussed above. Furthermore, the electrodes 13', 15' in the third embodiment are constructed to have the rugged surfaces, and it is therefore possible to have a larger surface area than by flatting the surfaces of those electrodes. This enables a further enlargement of the surface area of the capacitor per unit chip area.

(Fourth Embodiment)

A fourth embodiment of the present invention deals with a manufacturing method of manufacturing the DRAM having the construction shown in FIG. 23. According to this manufacturing method, to begin with, the same processes as the above steps shown in FIGS. 11–22, thereby obtaining a construction illustrated in FIG. 21.

Figure 24:
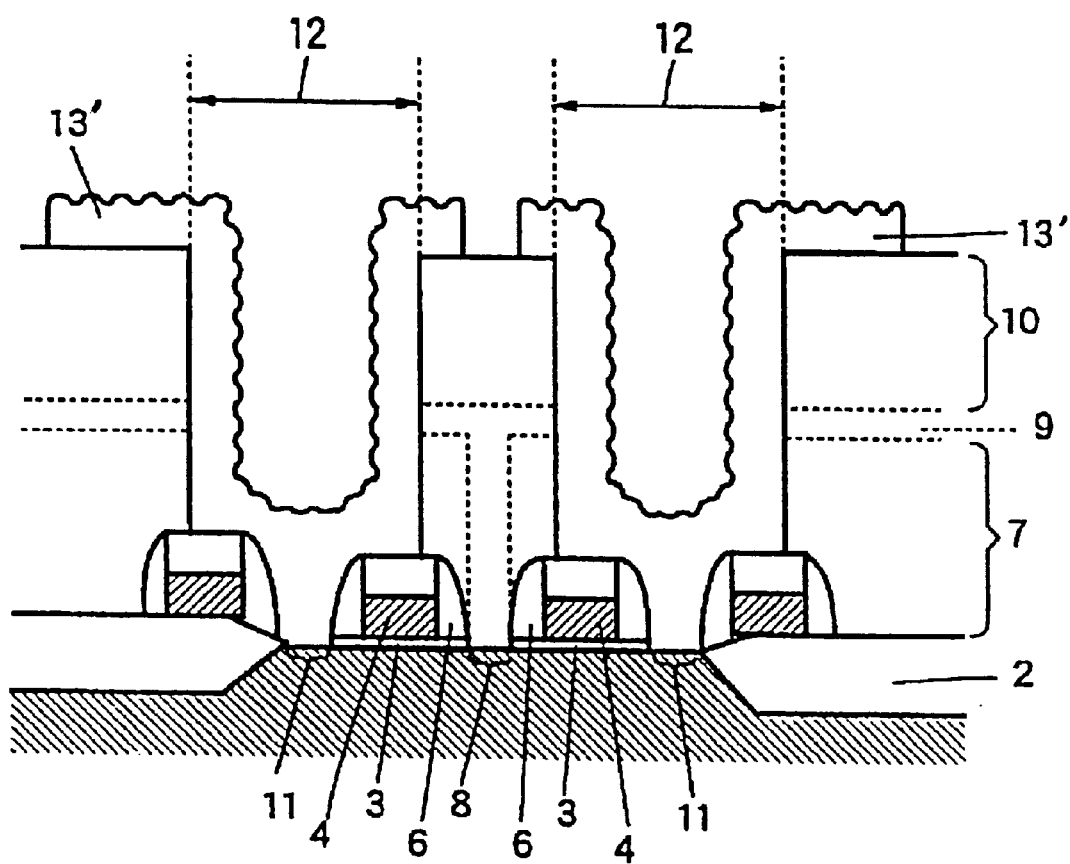
FIG. 24 is a sectional view showing the manufacturing steps in the method of manufacturing the DRAM in a fourth embodiment of the present invention.

Next, by using the CVD method, an electrode layer of polysilicon, etc. is formed in thickness that is less than ½ the width of the hole 12. On this occasion, after a flat layer has been formed by the ordinary CVD method, particles of, e.g., polysilicon, etc. are adhered onto this layer, thus forming a particled rough surface. Then, unnecessary polysilicon is removed by the photolithography, and thereupon, as shown in FIG. 24, the electrode 13' having a rugged surface is formed.

Thereafter, when an insulating film (a capacitor insulating film) 14' such as an oxide film and a nitride film is formed on the surface of the electrode 13' by the thermal nitriding, the thermal oxidation or the CVD method, etc., the capacitor insulating film 14' having a ruggedness corresponding to the ruggedness of the surface of the electrode 13'. Finally, an electrode 15 composed of polysilicon or the like is formed by the CVD method, and a DRAM having a structure shown in FIG. 23 is thereby completed.

The fourth embodiment exhibits the same effects as those in the second embodiment discussed above. Furthermore, the electrodes 13', 15' in the fourth embodiment are constructed to have the rugged surfaces, and it is therefore possible to have a larger surface area than by flatting the surfaces of those electrodes. This enables a further enlargement of the surface area of the capacitor per unit chip area.

(Fifth Embodiment)

Figure 25:
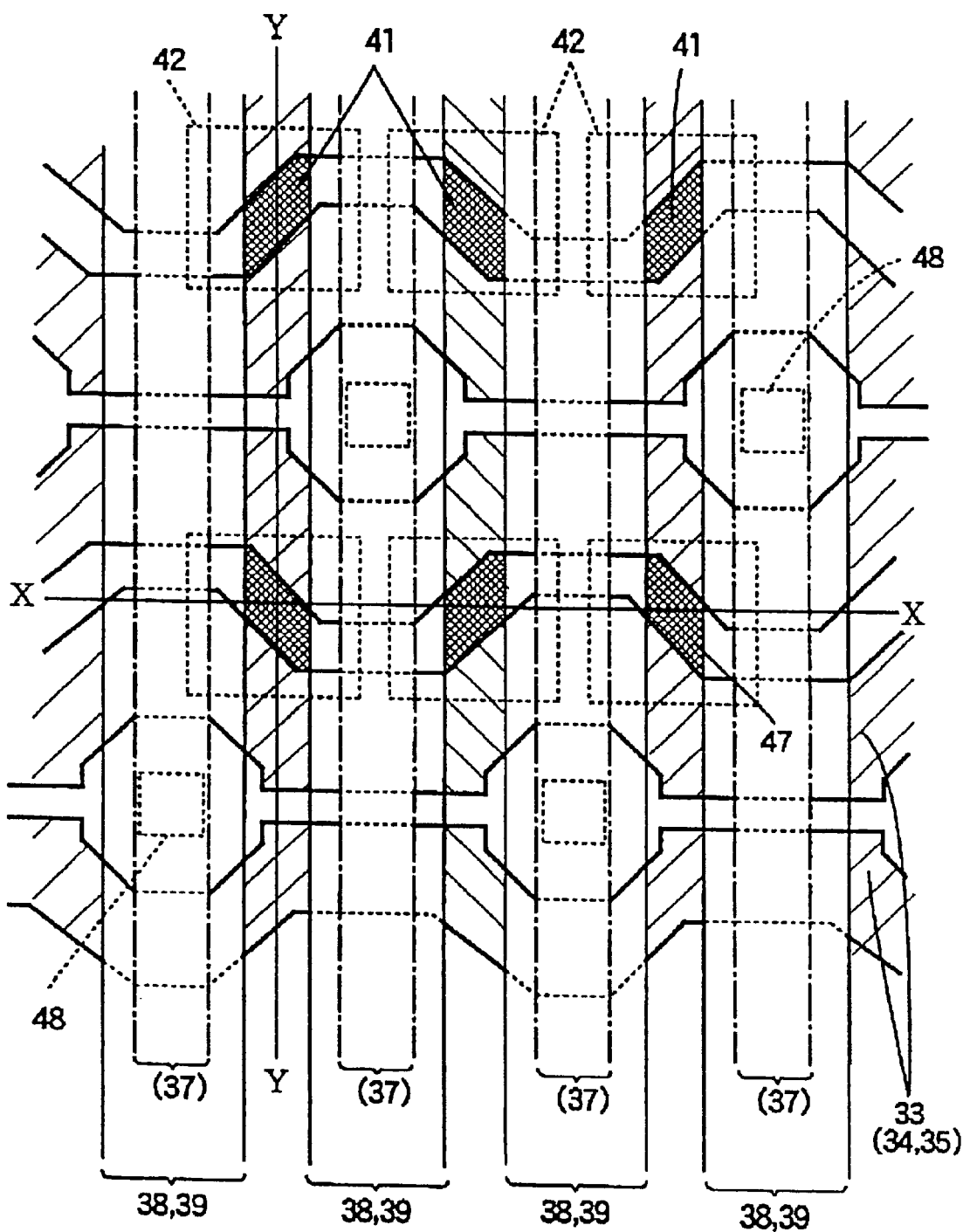
FIG. 25 is a plan view showing a structure of the principal portion of the DRAM in a fifth embodiment of the present invention.
Figure 26:
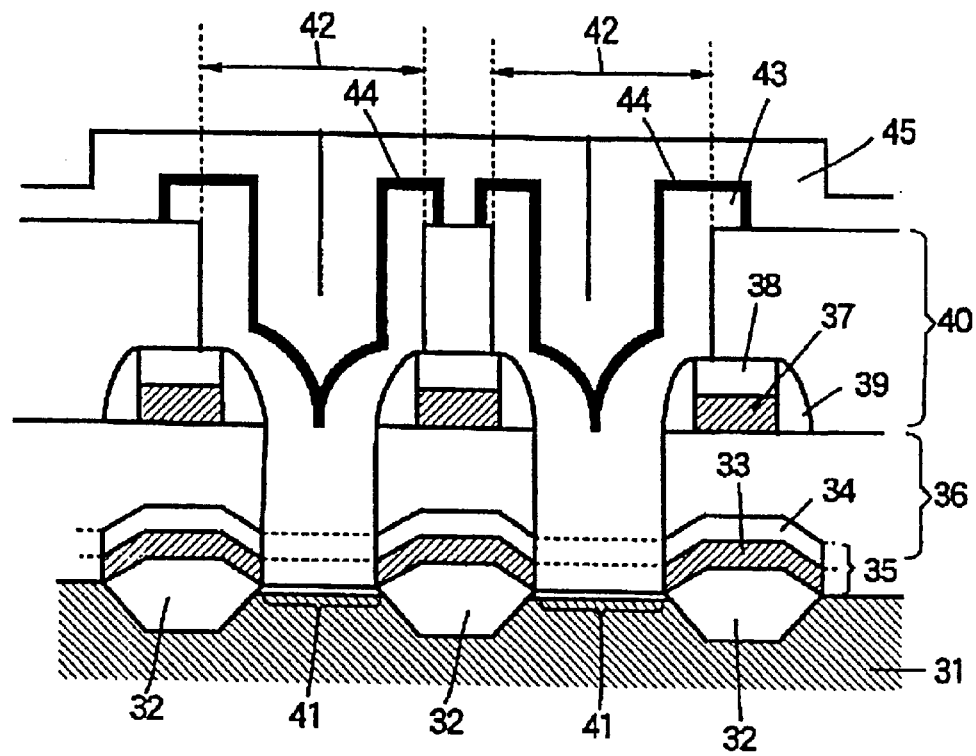
FIG. 26 is a sectional view showing the structure of the principal portion of the above DRAM.
Figure 27:
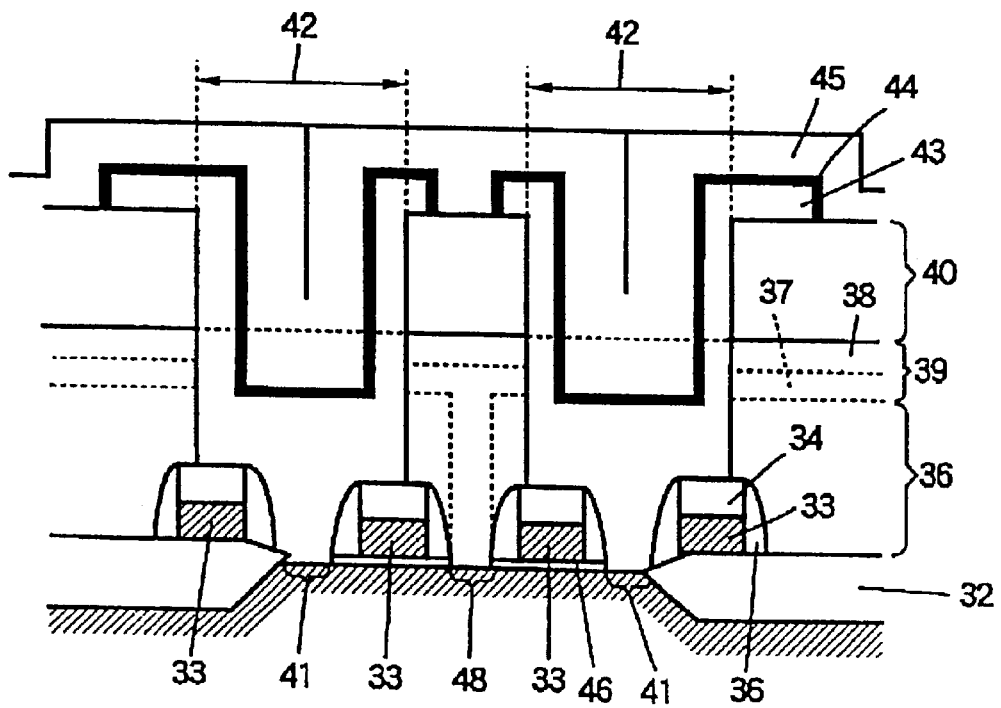
FIG. 27 is a sectional view showing the structure of the principal portion of the DRAM.

FIGS. 25–27 are views showing a structure of capacitors of the DRAM in a fifth embodiment of the present invention. FIG. 25 is a top view of the DRAM. FIGS. 26 and 27 are views respectively schematically showing an X—X section and a Y—Y section.

In the DRAM with the construction shown in FIGS. 1, 9 and 10 or 23, the protection layer (the $Si_3N_4$ films 5, 6, and the protection layer) is provided on only the electrode (the gate electrode) 4 of the lowest layer, and the memory cell contact (the hole 11) is holed based on the self alignment. In accordance with the fifth embodiment, however, a protection layer ($Si_3N_4$ films 38, 39, and a second protection layer) is provided also on an electrode (a bit line) 37 of an upper layer, and a memory cell contact (a hole 41) is holed based on the self alignment.

Provided on a substrate (a semiconductor substrate) 31 are a field oxide film 32 for separation between elements and an electrode (a gate electrode) 33 formed on the field oxide film 32. An $Si_3N_4$ film (a first protection layer) 34 is provided on this electrode 33, and a side wall 35 is provided extending from a side surface of the electrode 33 to a side surface of the $Si_3N_4$ film 34.

Formed further on the $Si_3N_4$ film and the side wall 35 is an inter-layer film (an inter-layer insulating layer) 36 for separation from layers to be formed thereon. Formed on this inter-layer film 36 are an electrode second signal line) 37, a $Si_3N_4$ film (a second protection layer) 38 and a side wall 39, which have the same constructions as those of the electrode 4, the $Si_3N_4$ film 5 and the side wall 6 that are shown in FIGS. 1, 9 and 10. Formed moreover on the $Si_3N_4$ film 38 and the side wall 39 is an inter-layer film (an inter-layer insulating layer) 40 for separation from layers to be provided thereon. Note that the electrode 37 and the protection layers 38, 39, as illustrated in FIGS. 25 and 27, do not exist on the Y—Y section in FIG. 25.

Then, a hole (an opening) 42 is formed penetrating the inter-layer films 40, 36. A hole 41 through which to expose a part of a substrate 41 that is not covered with the protection layers 34, 35, is formed in the bottom of the hole 42. A capacitor for accumulating an electric charge corresponding to data to be held, is formed inwardly of this hole 42.

This capacitor comprises an electrode (a first conductive layer) 43 so provided on surfaces of the inter-layer films 36, 40 as to extend from the hole 41 along the periphery of the hole 42, and connected to the substrate 31 exposed from the hole 41. The capacitor also comprises a capacitor insulating film 44 formed on the surface of this electrode 33, and an electrode (a second conductive layer) 45 further provided thereon. Namely, the hole 41 serves as a memory cell contact for connecting the substrate 3 to the electrode 43.

The substrate 31 is composed of Si monocrystal. The field oxide film 32 is formed in thickness on the order of 2000–4000 A on this substrate 31 by the ordinary LOCOS method. The electrode 33 is composed of polysilicon or polycide and formed in thickness of approximately 1000–3000 A. The side wall 35 is composed of $Si_3N_4$ as in the case of the $Si_3N_4$ film 34, which have a thickness on the order of 1000–3000 A.

The inter-layer film 36 is composed of BPSG and is approximately 3000–5000 A in thickness. The electrode 37 is composed of polysilicon or polycide and has a thickness of approximately 1000–2000 A. This electrode 37 covered in thickness of approximately 1000–3000 A with the $Si_3N_4$ film 38 and the $Si_3N_4$ film 39 of the side wall. The inter-layer film 40 is composed of BPSG as in the case of the inter-layer film 36 and has a thickness of approximately 3000–5000 A. The electrode 43 is composed of polysilicon, etc. and has a thickness that is less than ½ the width of the hole 42.

The hole 41 is formed by high selection ratio etching to selectively etch the inter BPSG layer films 36, 40 with respect to the $Si_3N_4$ films 38, 39. Further, this etching exhibits a high up-and-down directivity in FIG. 27, i.e., in the direction perpendicular to the sheet surface of FIG. 25, and, as illustrated in FIG. 26, the inter-layer film 36 covered with the $Si_3N_4$ films 38, 39 are left without being etched. Therefore, an aperture area of the hole 41 is smaller than an aperture area of the upper portion of the hole 42.

As discussed above, in accordance with the fifth embodiment, the memory cell contact is formed involving the use of the self alignment, and it is therefore feasible to enlarge the aperture area of the memory cell contact (the hole 42) while keeping small the aperture area of the bottom surface (the hole 41) of the memory cell contact. The memory cell contact can be thereby formed on the gate electrode, and the side wall of the contact (the hole 42) can be used as a capacitor surface area by providing the gate electrode having a thickness less than ½ the width of the hole inwardly of the memory cell contact. Accordingly, the surface area of the capacitor per unit chip area can be set larger than by the prior art. An occupying area on the chip can be thereby reduced while keeping a capacity of the capacitor.

Further, the hole area of the hole 12 can be taken large, and hence a margin when holing the resist layer through a pattern transfer can be enlarged in the photolithography in the case of holing the memory cell contact.

(Sixth Embodiment)

A sixth embodiment of the present invention deals with a manufacturing method of manufacturing the DRAM having a construction shown in FIGS. 25–27. FIGS. 28–34 show respective steps of this manufacturing method.

Figure 28:
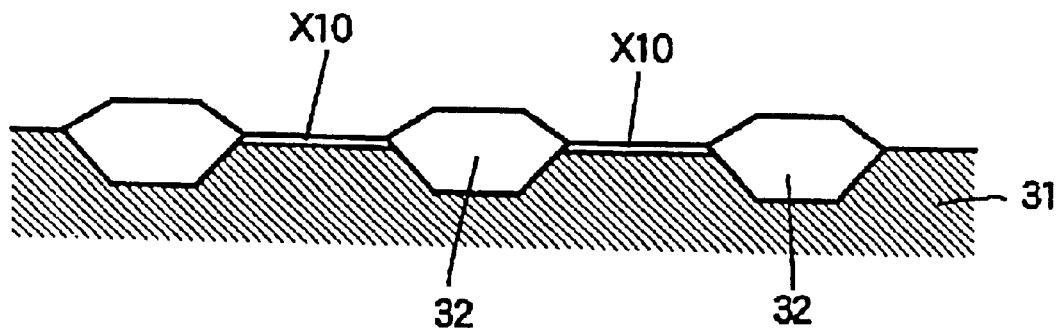
FIG. 28 is a sectional view showing the manufacturing steps in the method of manufacturing the DRAM in a sixth embodiment of the present invention.

According to this manufacturing method, to start with, a field oxide film 32 having a thickness of approximately 2000–4000 A is formed on a Si monocrystal semiconductor substrate 31. This step generally involves the use of the LOCOS method. Thereafter, as illustrated in FIG. 28, a gate oxide film x10 of MOS-Tr is formed in thickness of approximately 50–150 A.

Figure 29:
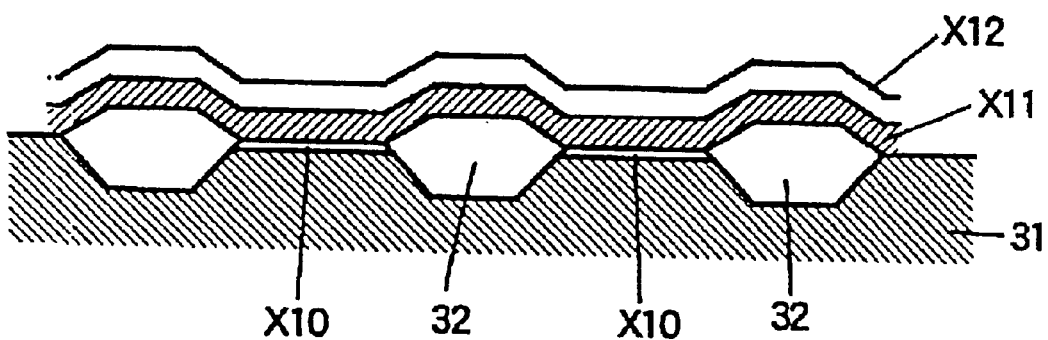
FIG. 29 is a sectional view showing the manufacturing steps in the method of manufacturing the above DRAM.

Next, a layer x11, which is composed of polysilicon or polycide and will become an electrode 33 afterward, is formed in thickness on the order of 1000–3000 A on the field oxide film 32 and the gate oxide film x10 by the CVD (Chemical Vapor Deposition) method. Then, as shown in FIG. 29, a $Si_3N_4$ layer x12, which will become a $Si_3N_4$ film 34 afterward, is formed in thickness of approximately 1000–3000 A on this layer x11.

Figure 30:
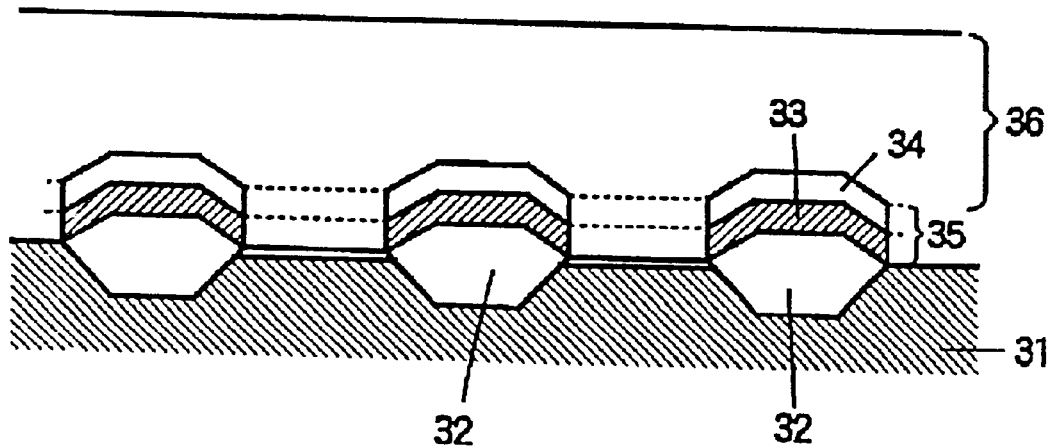
FIG. 30 is a sectional view showing the manufacturing steps in the method of manufacturing the above DRAM.
Figure 31:
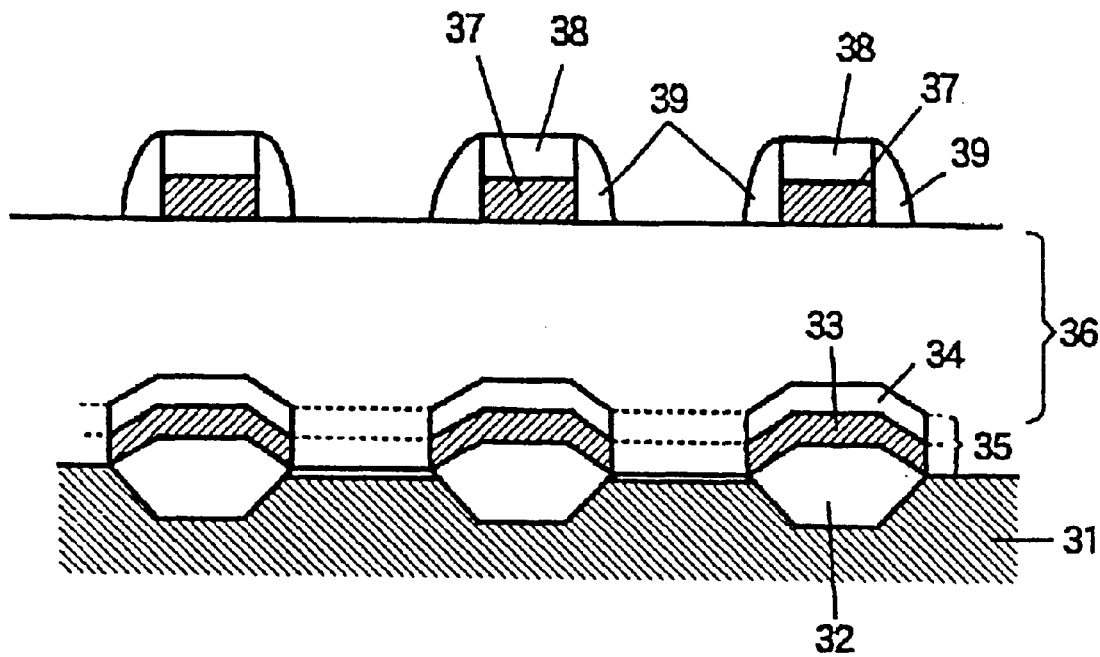
FIG. 31 is a sectional view showing the manufacturing steps in the method of manufacturing the above DRAM.

Thereafter, the electrode 33, the $Si_3N_4$ film 34 and the side wall 35 are formed by executing the same patterning process as those shown in FIGS. 13–16. After this processing, as illustrated in FIG. 30, a BPSG film 36 is formed in thickness of approximately 3000–5000 A thereon by the CVD method, and the upper surface is flattened by effecting a flow.

Upon an end of flatting process, a layer of polysilicon or polycide and a $Si_3N_4$ layer are provided on the BPSG film 36. Then, by executing the same patterning process as the one described above, as shown in FIG. 31, an electrode 37, a $Si_3N_4I$ film 38 and a side wall 39 are formed.

Figure 32:
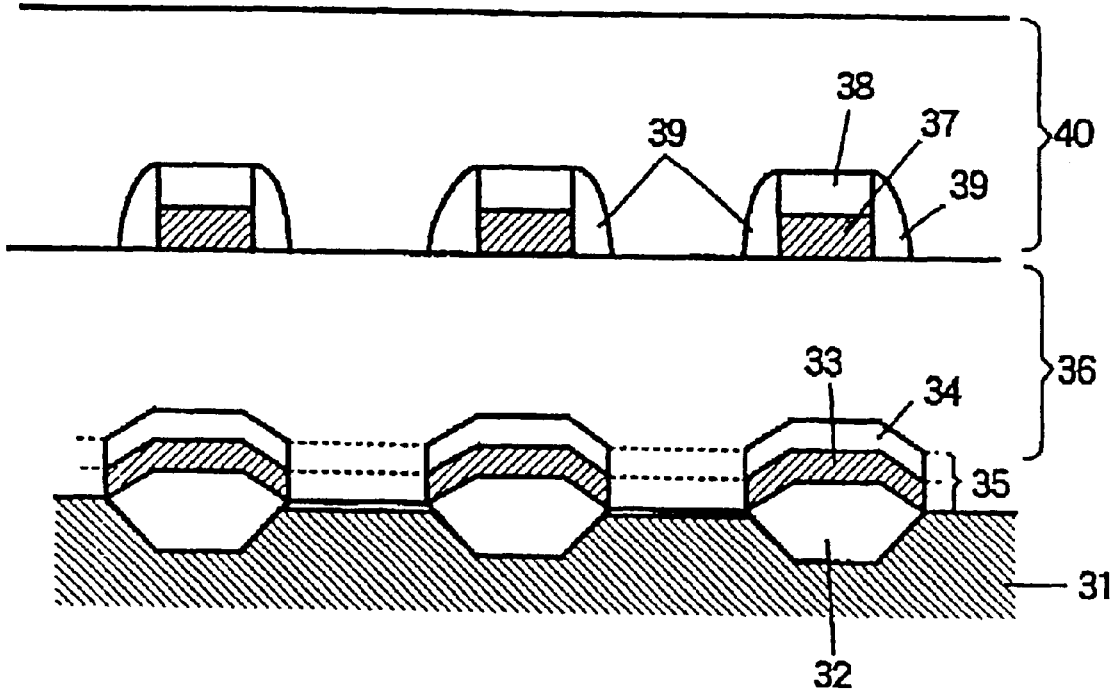
FIG. 32 is a sectional view showing the manufacturing steps in the method of manufacturing the above DRAM.
Figure 33:
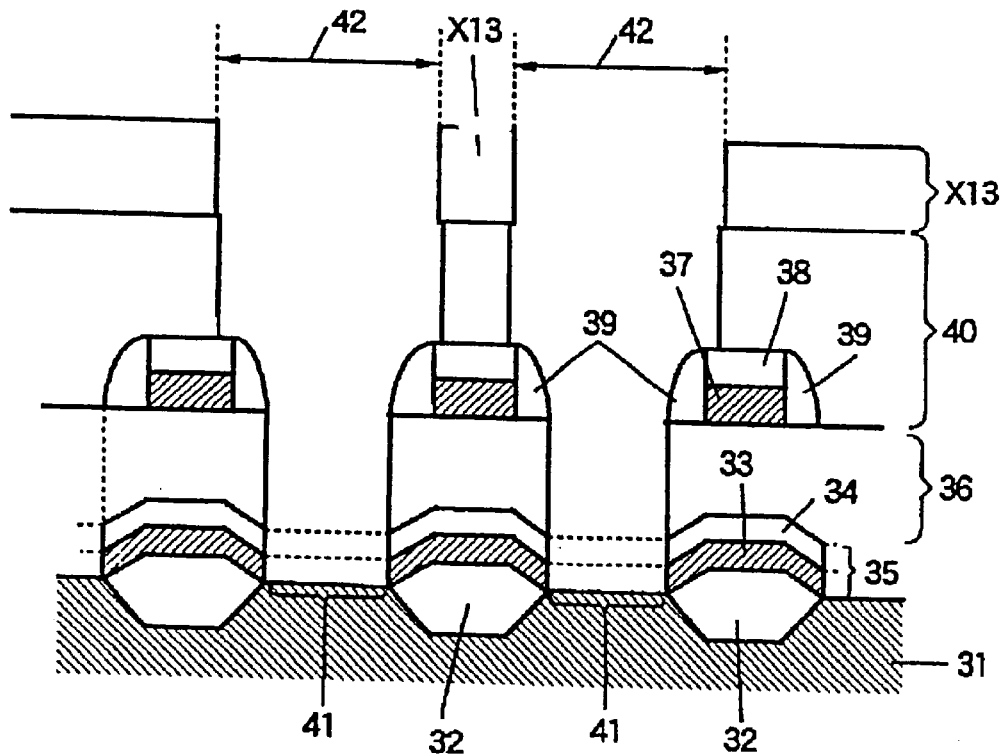
FIG. 33 is a sectional view showing the manufacturing steps in the method of manufacturing the above DRAM.

Thereafter, as shown in FIG. 32, a BPSG film 40 having a thickness of about 3000–5000 A is formed thereon by the CVD method, and the upper surface is flattened by effecting a flow. When the flatting process is ended, a photoresist layer x13 is provided on the BPSG film 40, and the photoresist of a portion corresponding to the hole 42 is removed.

After removing the photoresist, the selectivity etching is carried out. This selectivity etching is a process of selectively etching the oxide films (the BPSG films 36, 40) with respect to the nitride films (the $Si_3N_4$ films 34, 35, 38, 39). Further, this etching exhibits a high directivity perpendicular to the sheet surface of FIG. 33, and, as shown in the Figure, the inter-layer film 36 covered with the $Si_3N_4$ films 38, 39 is left without being etched. This etching process involves the use of a gas mixed with $C_4F_8$, CO, Ar, $O_2$, or a gas obtained by adding $CH_2F_2$, $CHF_3$ thereto. Note that a composition ratio of this gas is properly varied corresponding to a size (e.g., a width of the hole) of the device. The oxide films (the BPSG films 36, 40) are selectively etched with respect to the nitride films (the $Si_3N_4$ films 34, 36).

A protection layer exhibiting a durability against the etching of the nitride films (the $Si_3N_4$ films 38, 39) is formed, and, with the self alignment for forming the hole 41 by effecting the selective etching, the hole 42 is formed, whereby a width of the hole 41 can be set smaller than a width of the upper portion of the hole 12.

Figure 34:
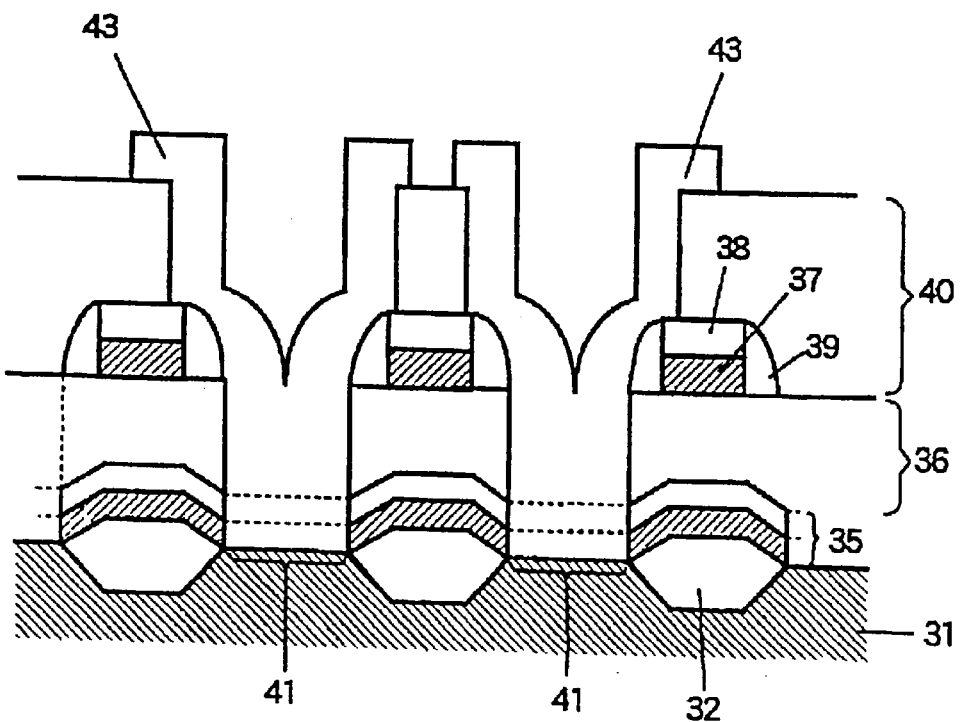
FIG. 34 is a sectional view showing the manufacturing steps in the method of manufacturing the above DRAM.

Thereafter, an electrode layer of polysilicon having a thickness less than ½ the width of the hole 12, is formed by the CVD method, and unnecessary polysilicon is removed by the photolithography, with the result that an electrode 43 is formed as shown in FIG. 34.

Thereafter, an insulating film (a capacitor insulating film) 44 such as an oxide film and a nitride film is formed on the surface of the electrode 43 by the thermal nitriding, the thermal oxidation or the CVD method, etc., and finally an electrode 45 composed of polysilicon or the like is formed by the CVD method, etc.

A DRAM is thereby completed with a structure illustrated in FIGS. 25–27.

As mentioned above, in accordance with the sixth embodiment, the self alignment is used for forming the memory cell contact, thereby enabling the aperture area of the memory cell contact (the hole 12) to enlarge while keeping small the aperture area of the bottom surface (the hole 11) of the memory cell contact. Therefore, the gate electrode can be provided inwardly of the memory cell contact (the hole 12), whereby the side wall of the contact (the hole 12) can be used as a capacitor surface area. Accordingly, the surface area of the capacitor per unit chip area can be set larger than by the prior art.

Further, the aperture area of the hole 12 can be taken large, and hence it is feasible to enlarge the margin when holing the resists layer through the pattern transfer in the photolithography in the case of holing the memory cell contact.

Note that BPSG (borophosphosilicate glass: an oxide film to which boron and phosphorus are added) is used for the inter-layer films 36, 40 in the fifth and sixth embodiments discussed above, but the oxide films may also be used. In this case, the etching process with a high selectivity can be executed as in the case described above by changing the composition of the gas.

(Seventh Embodiment)

Figure 35:
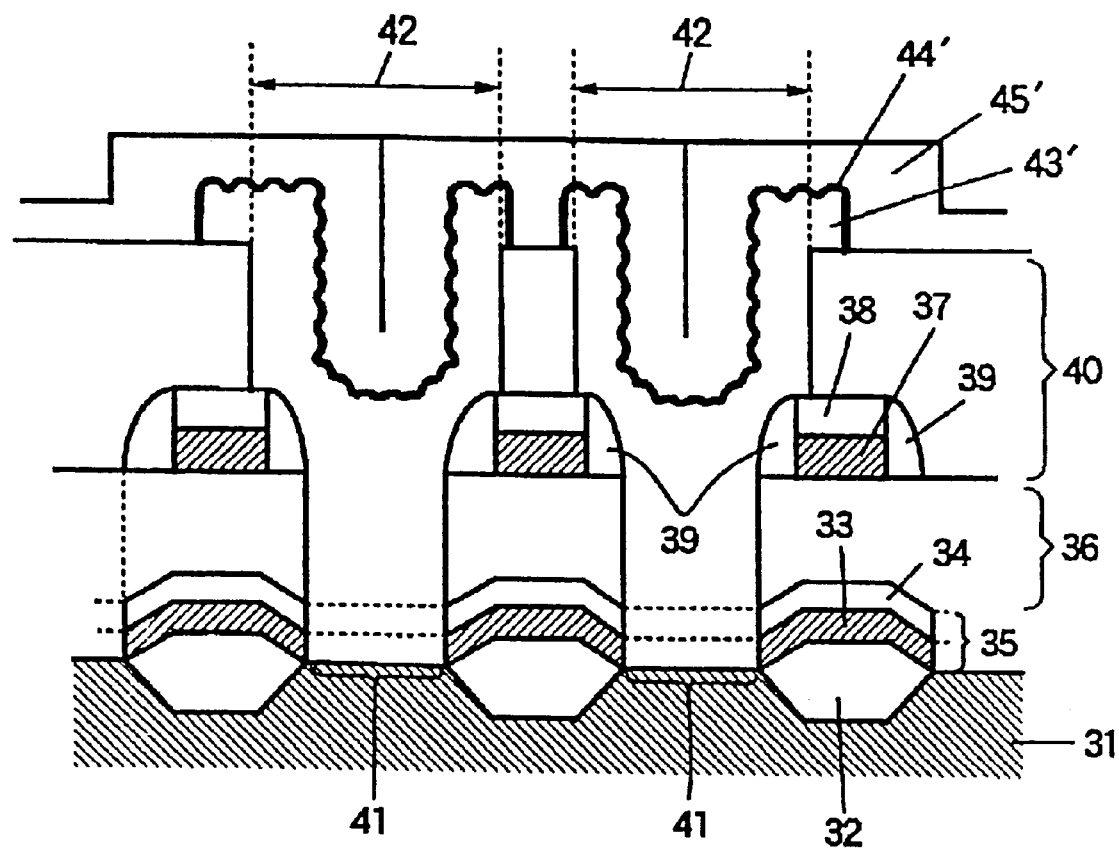
FIG. 35 is a sectional view showing a structure of the principal portion of the DRAM in a seventh embodiment of the present invention.

FIG. 35 is a view showing a structure of capacitors of the DRAM in accordance with a seventh embodiment of the present invention. FIG. 35 shows an X—X section in FIG. 25 and is, i.e., a sectional view corresponding to FIG. 26. In FIG. 35, the same or corresponding components as or to those in FIG. 26 are marked with the same numerals as those in FIG. 26. Further, a section corresponding to the Y—Y section is the same as FIG. 27 other than configurations of electrodes 43', 45' and is therefore omitted. Similarly, the plan view is the same as FIG. 25.

In the DRAM illustrated in FIGS. 25–27, the electrode 43 of the capacitor has a flat surface. In the seventh embodiment, however, as shown in FIG. 35, the electrode 43' has a rugged surface. This electrode 43' is, as in the case of the electrode 43 shown in FIGS. 25–27, composed of polysilicon and has a thickness less than ½ the width of the hole 42. A capacitor insulating film 44' and an electrode 45' also have rugged surfaces corresponding to the rugged surface of the electrode 43'.

The seventh embodiment exhibits the same effects as those in the fifth embodiment discussed above.

Furthermore, the electrodes 43', 45' in this embodiment are constructed to have the rugged surfaces, and it is therefore possible to have a larger surface area than by flatting the surfaces of those electrodes. This enables a further enlargement of the surface area of the capacitor per unit chip area.

(Eighth Embodiment)

An eighth embodiment of the present invention deals with a manufacturing method of manufacturing the DRAM having the construction shown in FIG. 35. According to this manufacturing method, at first, the same processes as the above steps shown in FIGS. 28–33, thereby obtaining a construction illustrated in FIG. 33.

Figure 36:
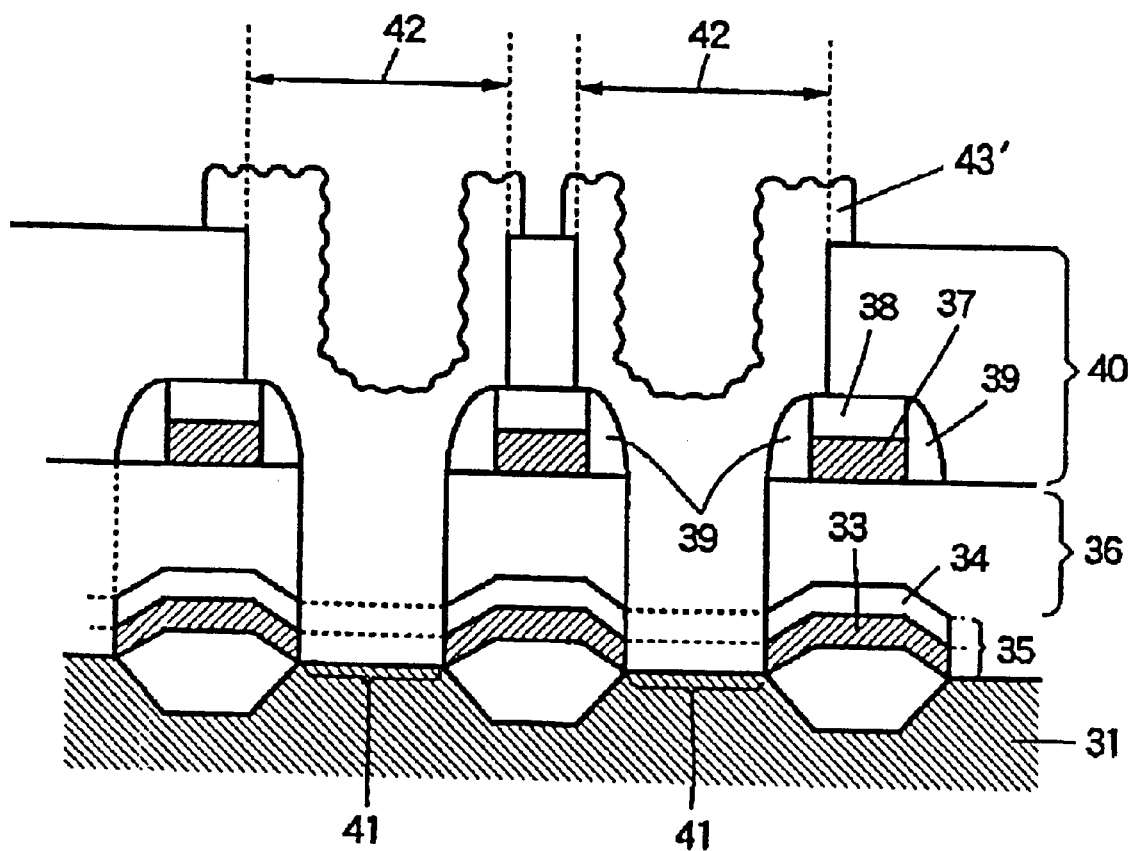
FIG. 36 is a sectional view showing the manufacturing steps in the method of manufacturing the DRAM in an eighth embodiment of the present invention.

Next, by using the CVD method, an electrode layer of polysilicon, etc. is formed in thickness less than ½ the width of the hole 12. On this occasion, after a flat layer has been formed by the ordinary CVD method, particles of, e.g., polysilicon, etc. are adhered onto this layer, thus forming a particled rough surface. Then, unnecessary polysilicon is removed by the photolithography, and thereupon, as shown in FIG. 36, the electrode 43' having a rugged surface is formed.

Thereafter, when an insulating film (a capacitor insulating film) 44' such as an oxide film and a nitride film is formed on the surface of the electrode 43 by the thermal nitriding, the thermal oxidation or the CVD method, etc., the capacitor insulating film 44' having a ruggedness corresponding to the ruggedness of the surface of the electrode 43'. Finally, an electrode 45 composed of polysilicon or the like is formed by the CVD method, and a capacitor having a structure shown in FIG. 35 is thereby completed.

The eighth embodiment exhibits the same effects as those in the sixth embodiment discussed above. Furthermore, the electrodes 43', 45' in the this embodiment are constructed to have the rugged surfaces, and it is therefore possible to have a larger surface area than by flatting the surfaces of those electrodes. This enables a further enlargement of the surface area of the capacitor per unit chip area.

Note that the protection layer is formed of the nitride film, and the intermediate layer is formed of BPSG in each embodiment discussed above. However, even when the protection layer is formed of the oxide film or a glass such as BPSG, the selection ratio of etching is adjusted by controlling a mixing ratio of the gas used for the etching process described above, thereby enabling a formation of the hole (the opening) an upper portion aperture area of which is larger than the area of the exposed substrate (the semiconductor substrate) in the same manner as the one described above.

According to the present invention, when forming the opening portion, the area of the upper portion of the hole can be set larger than the area of the semiconductor substrate that is exposed to the bottom of the hole. The capacitor is provided inwardly of this hole, whereby the area of the memory cell contact of the DRAM can be enlarged. Further, since the area of the upper portion of the hole can be enlarged, the aperture margin can be increased in the photolithography for the memory cell contact.

It is apparent that, in this invention, a wide range of different working modes can be formed based on the invention without deviating from the spirit and scope of the invention. This invention is not restricted by its specific working modes except being limited by the appended claims.

What is claimed is:

1. A method of manufacturing a semiconductor device, comprising:

forming a gate insulating film and a gate electrode on a semiconductor substrate;

forming an insulative protection layer on an upper portion of said gate electrode and along a side wall thereof;

forming an inter-layer insulating layer over said semiconductor substrate including over said insulative protection layer;

flattening an upper surface of said inter-layer insulating layer by effecting a flow;

forming an opening portion in said flattened inter-layer insulating layer, the opening portion extending to said insulative protection layer and to said semiconductor substrate, by selectively etching said inter-layer insulating layer; and after said forming an opening portion, forming a first conductive layer so as to extend from the upper surface to an interior surface of the opening portion, and forming a recess which is defined by the first conductive layer, wherein a peripheral edge of said first conductive layer is disposed directly on the upper surface of the inter-layer insulating layer;

forming a capacitor insulating film on the first conductive layer; and forming a second conductive layer on the capacitor insulating film, said second conductive layer being formed in said recess so as to completely fill said recess and said opening portion.

2. A method of manufacturing a semiconductor device according to claim 1, wherein said forming a first conductive layer comprises:

adhering conductive particles onto said first conductive layer.

3. A method of manufacturing a semiconductor device according to claim 1, wherein the entire first conductive layer is formed only after said forming an opening portion.

4. A method of manufacturing a semiconductor device according to claim 1, wherein the peripheral edge of said first conductive layer that is disposed directly on the upper surface of the inter-layer insulating layer is an outermost peripheral edge of said first conductive layer; and wherein said first conductive layer has a thickness, and the outermost peripheral edge has a height, as measured from the upper surface, that are each less than a width of the opening portion, with the peripheral edge height being equal to the thickness of said first conductive layer.

5. A method of manufacturing a semiconductor device according to claim 4, wherein the thickness of said first conductive layer and the height of the outermost peripheral edge is less than half of the width of the opening portion.

6. A method of manufacturing a semiconductor device, comprising:

forming a gate insulating film and a gate electrode to extend in a first direction on a semiconductor substrate;

forming an insulative protection layer on an upper portion of said gate electrode and along a side wall thereof;

forming a first inter-layer insulating layer, that is selectively etchable with respect to said insulative protection layer, over said semiconductor substrate including over said insulative protection layer;

forming a bit line to extend in a second direction that is substantially orthogonal to the first direction on said first inter-layer insulating layer so that the bit line extends orthogonally to the gate insulating film and the gate electrode;

forming a protection layer on an upper portion of said bit line and along a side wall thereof, the first inter-layer insulating layer being selectively etchable with respect to said protection layer;

forming a second inter-layer insulating layer having an insulating property on said first inter-layer insulating layer including on said protection layer, the second inter-layer insulating layer being selectively etchable with respect to insulative protection layer and said protection layer;

flattening an upper surface of said second inter-layer insulating layer by effecting a flow;

forming an opening portion in said flattened second inter-layer insulating layer and said first inter-layer insulating layer, the opening portion extending to said insulative protection layer and said protection layer and said semiconductor substrate, by selectively etching said first and second inter-layer insulating layers; and after said forming an opening portion, forming a first conductive layer so as to extend from the upper surface to an interior surface of the opening portion, and forming a recess which is defined by a first conductive layer, wherein a peripheral edge of said first conductive layer is disposed directly on the upper surface of the inter-layer insulating layer;

forming a capacitor insulating film on the first conductive layer; and forming a second conductive layer on the capacitor insulating film, said second conductive layer being formed in said recess so as to completely fill said recess and said opening portion.

7. A method of manufacturing a semiconductor device according to claim 6, wherein said forming a first conductive layer comprises:

adhering conductive particles onto said first conductive layer.

8. A method of manufacturing a semiconductor device according to claim 6, wherein the entire first conductive layer is formed only after said forming an opening portion.

9. A method of manufacturing a semiconductor device according to claim 6, wherein the peripheral edge of said first conductive layer that is disposed directly on the upper surface of the inter-layer insulating layer is an outermost peripheral edge of said first conductive layer; and wherein said first conductive layer has a thickness, and the outermost peripheral edge has a height, as measured from the upper surface, that are each less than a width of the opening portion, with the peripheral edge height being equal to the thickness of said first conductive layer.

10. A method of manufacturing a semiconductor device according to claim 9, wherein the thickness of said first conductive layer and the height of the outermost peripheral edge is less than half of the width of the opening portion.

11. A method of manufacturing a semiconductor device, comprising:

forming a first gate electrode and a second gate electrode on a semiconductor substrate;

forming first insulative protection layers along side walls of said first and second gate electrodes and facing each other between the first gate electrode and the second gate electrode;

forming second insulative protection layers on the first gate electrode and the second gate electrode;

forming an inter-layer insulating layer on the semiconductor substrate including on the first insulative protection layers and second insulative protection layers;

flattening an upper surface of the inter-layer insulating layer by effecting a flow;

forming an opening in said flattened inter-layer insulating layer by selectively etching said inter-layer insulating layer, the opening exposing the first and second insulative protection layers and the semiconductor substrate between the first insulative layers, and extending from on the second insulative protection layer on the first gate electrode to on the second insulative protection layer on the second gate electrode; and after said forming an opening, forming a first conductive layer so as to extend from the upper surface to an interior surface of the opening, and forming a recess which is defined by the first conductive layer, wherein a peripheral edge of said first conductive layer is disposed directly on the upper surface of the inter-layer insulating layer;

forming a capacitor insulating film on the first conductive layer; and forming a second conductive layer on the capacitor insulating film, said second conductive layer being formed in said recess so as to completely fill said recess and said opening.

12. A method of manufacturing a semiconductor device according to claim 11, wherein said forming a first conductive layer includes:

forming the first conductive layer inwardly of said opening;

wherein said first conductive layer, capacitor insulating film, and second conductive layer are formed inwardly of said opening.

13. A method of manufacturing a semiconductor device according to claim 11, wherein the entire first conductive layer is formed only after said forming an opening.

14. A method of manufacturing a semiconductor device according to claim 11, wherein the peripheral edge of said first conductive layer that is disposed directly on the upper surface of the inter-layer insulating layer is an outermost peripheral edge of said first conductive layer; and wherein said first conductive layer has a thickness, and the outermost peripheral edge has a height, as measured from the upper surface, that are each less than a width of the opening portion, with the peripheral edge height being equal to the thickness of said first conductive layer.

15. A method of manufacturing a semiconductor device according to claim 14, wherein the thickness of said first conductive layer and the height of the outermost peripheral edge is less than half of the width of the opening portion.

* * * * *

UNITED STATES PATENT AND TRADEMARK OFFICE
CERTIFICATE OF CORRECTION

PATENT NO.     : 6,383,866 B1
DATED          : July 18, 2002
INVENTOR(S)    : Toshikazu Mizukoshi et al.

It is certified that error appears in the above-identified patent and that said Letters Patent is hereby corrected as shown below:

Column 1,
Lines 4 and 5, prior to the first line of the specification please insert the following:
-- This application is a divisional of application no. 08/941,065, filed on September 30, 1997. --

Signed and Sealed this

Fourth Day of February, 2003

JAMES E. ROGAN
*Director of the United States Patent and Trademark Office*